(12) United States Patent
Rubinsztain et al.

(10) Patent No.: US 11,630,130 B2
(45) Date of Patent: Apr. 18, 2023

(54) CHANNEL SENSITIVITY MATCHING

(71) Applicant: Allegro MicroSystems, LLC, Manchester, NH (US)

(72) Inventors: Ezequiel Rubinsztain, Buenos Aires (AR); Leandro Fuentes, Caba (AR); Juan Guido Salaya Velazquez, Buenos Aires (AR)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

(21) Appl. No.: 17/218,315

(22) Filed: Mar. 31, 2021

(65) Prior Publication Data

US 2022/0317161 A1    Oct. 6, 2022

(51) Int. Cl.
*G01R 15/20* (2006.01)
*G01R 33/00* (2006.01)

(52) U.S. Cl.
CPC ....... *G01R 15/207* (2013.01); *G01R 33/0029* (2013.01); *G01R 33/0035* (2013.01); *G01R 15/202* (2013.01); *G01R 15/205* (2013.01)

(58) Field of Classification Search
CPC .............. G01R 15/207; G01R 33/0029; G01R 33/0035; G01R 15/202; G01R 15/205
See application file for complete search history.

(56) References Cited

U.S. PATENT DOCUMENTS

| | | | |
|---|---|---|---|
| 4,236,832 A | 12/1980 | Komatsu et al. | |
| 4,438,347 A | 3/1984 | Gehring | |
| 4,752,733 A | 6/1988 | Petr et al. | |
| 4,758,943 A | 7/1988 | Aström et al. | |
| 4,760,285 A | 7/1988 | Nelson | |
| 4,823,075 A | 4/1989 | Alley | |

(Continued)

FOREIGN PATENT DOCUMENTS

| | | |
|---|---|---|
| CN | 1501093 A | 6/2004 |
| CN | 2009-86484 Y | 12/2007 |

(Continued)

OTHER PUBLICATIONS

U.S. Non-Final Office Action dated Aug. 25, 2021 for U.S. Appl. No. 16/826,451; 15 Pages.

(Continued)

*Primary Examiner* — Feba Pothen
(74) *Attorney, Agent, or Firm* — Daly, Crowley, Mofford & Durkee, LLP

(57) ABSTRACT

A sensor includes: a reference magnetic field generator configured to generate a reference magnetic field that is modulated at a first frequency, a first magnetic field sensing element that is configured to generate a first internal signal that is modulated at a second frequency, and a second magnetic field sensing element that is configured to generate a second internal signal that is modulated at the second frequency. A first amplifier is configured to receive the first internal signal and output a first amplified signal; and a second amplifier is configured to receive the second internal signal and output a second amplified signal. A gain adjustment circuit is configured to produce a gain adjustment signal and adjust a gain of at least one of the first amplifier and the second amplifier based on the gain adjustment signal.

22 Claims, 10 Drawing Sheets

(56) References Cited

U.S. PATENT DOCUMENTS

| | | |
|---|---|---|
| 4,833,406 A | 5/1989 | Foster |
| 4,970,411 A | 11/1990 | Haig et al. |
| 5,247,278 A | 9/1993 | Pant et al. |
| 5,285,155 A | 2/1994 | Ueda et al. |
| 5,329,416 A | 7/1994 | Ushiyama et al. |
| 5,343,143 A | 8/1994 | Voisine et al. |
| 5,412,255 A | 5/1995 | Wallrafen |
| 5,424,558 A | 6/1995 | Borden et al. |
| 5,469,058 A | 11/1995 | Dunnam |
| 5,521,501 A | 5/1996 | Dettmann et al. |
| 5,621,319 A | 4/1997 | Bilotti et al. |
| 5,640,090 A | 6/1997 | Furuya et al. |
| 5,844,140 A | 12/1998 | Seale |
| 6,011,770 A | 1/2000 | Tan |
| 6,351,506 B1 | 2/2002 | Lewicki |
| 6,392,478 B1 | 5/2002 | Mulder et al. |
| 6,436,748 B1 | 8/2002 | Forbes et al. |
| 6,437,558 B2 | 8/2002 | Li et al. |
| 6,853,178 B2 | 2/2005 | Hayat-Dawoodi |
| 6,896,407 B2 | 5/2005 | Nomiyama et al. |
| 6,917,321 B1 | 7/2005 | Haurie et al. |
| 6,995,315 B2 | 2/2006 | Sharma et al. |
| 7,038,448 B2 | 5/2006 | Schott et al. |
| 7,075,287 B1 | 7/2006 | Mangtani et al. |
| 7,166,807 B2 | 1/2007 | Gagnon et al. |
| 7,190,784 B2 | 3/2007 | Li |
| 7,259,545 B2 | 8/2007 | Stauth et al. |
| 7,292,095 B2 | 11/2007 | Burt et al. |
| 7,319,319 B2 | 1/2008 | Jones et al. |
| 7,323,870 B2 | 1/2008 | Tatschl et al. |
| 7,325,175 B2 | 1/2008 | Momtaz |
| 7,345,470 B2 | 3/2008 | Suzuki |
| 7,425,821 B2 | 9/2008 | Monreal et al. |
| 7,474,093 B2 | 1/2009 | Ausserlechner |
| 7,476,816 B2 | 1/2009 | Doogue et al. |
| 7,518,354 B2 | 4/2009 | Stauth et al. |
| 7,598,601 B2 | 10/2009 | Taylor et al. |
| 7,605,647 B1 | 10/2009 | Romero et al. |
| 7,635,993 B2 | 12/2009 | Boeve |
| 7,694,200 B2 | 4/2010 | Forrest et al. |
| 7,701,208 B2 | 4/2010 | Nishikawa |
| 7,709,754 B2 | 5/2010 | Doogue et al. |
| 7,729,675 B2 | 6/2010 | Krone |
| 7,746,056 B2 | 6/2010 | Stauth et al. |
| 7,764,118 B2 | 7/2010 | Kusuda et al. |
| 7,769,110 B2 | 8/2010 | Momtaz |
| 7,800,389 B2 | 9/2010 | Friedrich et al. |
| 7,923,996 B2 | 4/2011 | Doogue et al. |
| 7,936,144 B2 | 5/2011 | Vig et al. |
| 7,961,823 B2 | 6/2011 | Kolze et al. |
| 7,990,209 B2 | 8/2011 | Romero |
| 8,030,918 B2 | 10/2011 | Doogue et al. |
| 8,080,994 B2 | 12/2011 | Taylor et al. |
| 8,128,549 B2 | 3/2012 | Testani et al. |
| 8,134,358 B2 | 3/2012 | Charlier et al. |
| 8,203,329 B2 | 6/2012 | Hohe et al. |
| 8,447,556 B2 | 5/2013 | Friedrich et al. |
| 8,542,010 B2 | 9/2013 | Cesaretti et al. |
| 8,680,846 B2 | 3/2014 | Cesaretti et al. |
| 8,692,546 B2 | 4/2014 | Cesaretti et al. |
| 8,818,749 B2 | 8/2014 | Friedrich et al. |
| 8,907,669 B2 | 12/2014 | Petrie |
| 9,099,638 B2 | 8/2015 | Wang et al. |
| 9,116,195 B2 | 8/2015 | Yamashita et al. |
| 9,151,807 B2 | 10/2015 | Friedrich et al. |
| 9,201,122 B2 | 12/2015 | Cesaretti et al. |
| 9,606,190 B2 | 3/2017 | Friedrich et al. |
| 9,645,220 B2 | 5/2017 | Cesaretti et al. |
| 9,664,494 B2 | 5/2017 | Fernandez et al. |
| 9,664,752 B2 | 5/2017 | Monreal et al. |
| 9,733,106 B2 | 8/2017 | Judkins, III et al. |
| 9,804,222 B2 | 10/2017 | Petrie et al. |
| 9,804,249 B2 | 10/2017 | Petrie et al. |
| 9,817,078 B2 | 11/2017 | Pepka et al. |
| 9,841,485 B2 | 12/2017 | Petrie et al. |
| 9,897,464 B2 | 2/2018 | Judkins, III et al. |
| 9,910,088 B2 | 3/2018 | Milano et al. |
| 10,073,136 B2 | 9/2018 | Milano et al. |
| 10,132,879 B2 | 11/2018 | Latham et al. |
| 10,145,908 B2 | 12/2018 | David et al. |
| 10,451,671 B2 | 10/2019 | Petrie et al. |
| 10,466,298 B2 | 11/2019 | Chaware et al. |
| 10,488,458 B2 | 11/2019 | Milano et al. |
| 10,495,699 B2 | 12/2019 | Burdette et al. |
| 10,527,703 B2 | 1/2020 | Monreal et al. |
| 10,866,122 B2 | 12/2020 | Weiland et al. |
| 2002/0084923 A1 | 7/2002 | Li |
| 2003/0038675 A1 | 2/2003 | Gailus et al. |
| 2003/0102909 A1 | 6/2003 | Motz |
| 2003/0151406 A1 | 8/2003 | Wan et al. |
| 2005/0253578 A1 | 11/2005 | Kawashima et al. |
| 2005/0258820 A1 | 11/2005 | Forster |
| 2006/0164080 A1 | 7/2006 | Popovic et al. |
| 2006/0202692 A1 | 9/2006 | Tatschl et al. |
| 2006/0253746 A1 | 11/2006 | Momtaz |
| 2007/0110199 A1 | 5/2007 | Momtaz et al. |
| 2007/0247141 A1 | 10/2007 | Pastre et al. |
| 2007/0285089 A1 | 12/2007 | Ibuki et al. |
| 2008/0094055 A1 | 4/2008 | Monreal et al. |
| 2008/0110987 A1 | 5/2008 | Cato et al. |
| 2008/0137784 A1 | 6/2008 | Krone |
| 2008/0238410 A1 | 10/2008 | Charlier et al. |
| 2008/0265880 A1 | 10/2008 | Nishikawa |
| 2009/0001964 A1 | 1/2009 | Strzalkowski |
| 2009/0001972 A1 | 1/2009 | Fernandez et al. |
| 2009/0085706 A1 | 4/2009 | Baarman et al. |
| 2009/0256559 A1 | 10/2009 | Ausserlechner et al. |
| 2010/0321105 A1 | 12/2010 | Romero |
| 2011/0031960 A1 | 2/2011 | Hohe et al. |
| 2011/0048102 A1 | 3/2011 | Fernandez et al. |
| 2011/0074405 A1 | 3/2011 | Doogue et al. |
| 2011/0119015 A1 | 5/2011 | Hirobe et al. |
| 2011/0298448 A1 | 12/2011 | Foletto et al. |
| 2011/0304325 A1 | 12/2011 | Walther et al. |
| 2012/0016614 A1 | 1/2012 | Hohe et al. |
| 2012/0016625 A1 | 1/2012 | Hernandez-Oliver et al. |
| 2012/0086442 A1 | 4/2012 | Haas et al. |
| 2012/0217960 A1 | 8/2012 | Ausserlechner |
| 2012/0274314 A1 | 11/2012 | Cesaretti et al. |
| 2013/0057256 A1 | 3/2013 | Ernst et al. |
| 2013/0057276 A1 | 3/2013 | Klein |
| 2013/0093412 A1 | 4/2013 | Anelli et al. |
| 2014/0184214 A1 | 7/2014 | Schäffer et al. |
| 2014/0210023 A1 | 7/2014 | Wang |
| 2014/0347044 A1 | 11/2014 | Monreal et al. |
| 2015/0008913 A1 | 1/2015 | Fu et al. |
| 2015/0022192 A1 | 1/2015 | Ausserlechner |
| 2015/0207061 A1 | 7/2015 | Ausserlechner |
| 2015/0301149 A1 | 10/2015 | Cesaretti et al. |
| 2015/0345990 A1 | 12/2015 | David et al. |
| 2015/0346289 A1 | 12/2015 | Ausserlechner |
| 2015/0354985 A1 | 12/2015 | Judkins, III et al. |
| 2016/0139229 A1 | 5/2016 | Petrie et al. |
| 2016/0139230 A1 | 5/2016 | Petrie et al. |
| 2017/0016965 A1 | 1/2017 | Chaware et al. |
| 2017/0123036 A1 | 5/2017 | Miyake |
| 2017/0131366 A1* | 5/2017 | Motz ............... G01R 33/07 |
| 2017/0184689 A1* | 6/2017 | Wang ............... G01R 33/0354 |
| 2017/0205447 A1* | 7/2017 | Saito ............... G01R 19/0092 |
| 2018/0011150 A1 | 1/2018 | Pepka et al. |
| 2018/0313912 A1 | 11/2018 | David et al. |
| 2018/0340911 A1 | 11/2018 | Romero |
| 2018/0340989 A1 | 11/2018 | Latham et al. |
| 2019/0049530 A1 | 2/2019 | Latham et al. |
| 2019/0113592 A1 | 4/2019 | Rigoni et al. |
| 2020/0049760 A1 | 2/2020 | Milano et al. |
| 2020/0057097 A1 | 2/2020 | Vuillermet et al. |
| 2020/0096576 A1 | 3/2020 | Rossi et al. |

(56) References Cited

U.S. PATENT DOCUMENTS

| | | | |
|---|---|---|---|
| 2020/0393529 | A1 | 12/2020 | Larson et al. |
| 2021/0293901 | A1* | 9/2021 | Dupre .................. G01R 33/07 |

FOREIGN PATENT DOCUMENTS

| | | |
|---|---|---|
| DE | 195 39 458 A1 | 4/1997 |
| DE | 196 06 826 A1 | 8/1997 |
| DE | 10 2004 017 191 A1 | 10/2005 |
| DE | 10 2005 047 413 A1 | 9/2006 |
| DE | 10 2006 037 226 A1 | 2/2008 |
| DE | 10 2007 041 230 B3 | 4/2009 |
| EP | 0 289 414 A2 | 11/1988 |
| EP | 0 289 414 A3 | 11/1988 |
| EP | 0 338 122 A1 | 10/1989 |
| EP | 0 357 013 A2 | 3/1990 |
| EP | 0 357 013 A3 | 3/1990 |
| EP | 1 637 898 A1 | 3/2006 |
| EP | 1 679 524 A1 | 7/2006 |
| EP | 1 850 143 A1 | 10/2007 |
| GB | 919 207 A | 2/1963 |
| GB | 2 276 727 A | 10/1994 |
| JP | S 63-11675 Y2 | 4/1988 |
| JP | 03-248611 | 11/1991 |
| JP | H06148777 | 5/1994 |
| JP | 2000-055999 | 2/2000 |
| JP | 2002-213992 | 7/2002 |
| JP | 2004-177228 | 6/2004 |
| JP | 2004-234589 | 8/2004 |
| JP | 2006-123012 A | 5/2006 |
| JP | 2006-126012 | 5/2006 |
| JP | 2008-513762 | 5/2008 |
| JP | 2011-052036 A | 3/2011 |
| KR | 10-2007-0060096 | 6/2007 |
| WO | WO 9602849 A1 | 2/1996 |
| WO | WO 2004/072672 | 8/2004 |
| WO | WO 2006/056829 | 6/2006 |
| WO | WO 2007/138508 A1 | 12/2007 |
| WO | WO 2008/048379 A1 | 4/2008 |
| WO | WO 2009/108422 A2 | 9/2009 |
| WO | WO 2009/108422 A3 | 9/2009 |
| WO | WO 2010/096367 A1 | 8/2010 |
| WO | WO 2010/097677 A1 | 9/2010 |
| WO | WO 2011/011479 A1 | 1/2011 |
| WO | WO 2016/077065 A1 | 5/2016 |
| WO | WO 2016/077066 A1 | 5/2016 |

OTHER PUBLICATIONS

Response to U.S. Non-Final Office Action dated Aug. 25, 2021 for U.S. Appl. No. 16/826,451; Response filed Sep. 9, 2021; 15 Pages.
U.S. Appl. No. 16/683,800, filed Nov. 14, 2019, David et al.
U.S. Appl. No. 16/826,451, filed Mar. 23, 2020, Ostermann et al.
U.S. Appl. No. 16/951,324, filed Nov. 18, 2020, Petrie et al.
Melexis Datasheet "MLX90371—Triaxis® Position Processor", Revision 004, Mar. 2019, 68 pages.
Melexis Datasheet "MLX90372—Triaxis® Position Processor", Revision 8, Mar. 8, 2019, 85 pages.
Melexis Application Note "Magnet Selection for MLX9037X—Rotary Stray-Field Immune Mode", Revision 001, 2017, 10 pages.
International Preliminary Report on Patentability dated Dec. 6, 2018 for International Application No. PCT/US2017/029588; 15 Pages.
Communication Pursuant to Rules 161(1) and 162 EPC dated Dec. 12, 2018 for European Application No. 17722302.1; 3 Pages.
Barrettino et al., "CMOS-Based Monolithic Controllers for Smart Sensors Comprising Micromembranes and Microcantilevers"; IEEE Transaction on Circuits and Systems—I. Regular Papers., vol. 54, No. 1, Jan. 2007; 12 pages.
Allegro MicroSystems, LLC, "Programmable Linear Hall with Advanced Diagnostics;" A1342 Preliminary Design Intent Datasheet; Revision 2.0 JJL; 44 Pages.
Allowed claims filed on Jun. 5, 2017 for JP Pat. Appl. No. 2015-013206; 2 pages.

Ausserlechner et al., "Compensation of the Piezo-Hall Effect in Integrated Hall Sensors on (100)-Si;" IEEE Sensors Journal, vol. 7, No. 11; Nov. 2007; pp. 1475-1482; 8 Pages.
Ausserlechner et al., "Drift of Magnetic Sensitivity of Smart Hall Sensors Due to Moisture Absorbed by the IC-Package;" Proceedings of IEEE Sensors Conference, vol. 1; Oct. 24, 2004; pp. 455-458; 4 Pages.
Ausserlechner, "Limits of Offset Cancellation by the Principle of Spinning Current Hall Probe;" Proceedings of IEEE Sensors Conference; Oct. 24, 2004; pp. 1117-1120; 4 Pages.
Ausserlechner, "The piezo-Hall effect in n-silicon for arbitrary crystal orientation;" Proceedings of IEEE Sensors Conference, vol. 3; Oct. 24, 2004; pp. 1149-1152; 4 Pages.
Bahreyni et al., "A Resonant Micromachined Magnetic Field Sensor;" IEEE Sensors Journal, vol. 7, No. 9, Sep. 2007; pp. 1326-1334; 9 Pages.
Baschirotto et al., "Development and Analysis of a PCB Vector 2-D Magnetic Field Sensor System for Electronic Compasses;" IEEE Sensors Journal, vol. 6, No. 2; Apr. 2006; pp. 365-371; 7 Pages.
Bilotti et al., "Monolithic Magnetic Hall Sensor Using Dynamic Quadrature Offset Cancellation;" Technical Paper STP 97-10: Product Description; IEEE Journal of Solid-State Circuits;, vol. 32, Issue 6; Jun. 1997; pp. 829-836; 8 Pages.
Chinese $2^{nd}$ Office Action (w/English Translation) dated Apr. 15, 2013 corresponding to Chinese Application No. 200980106535.4; 9 Pages.
Chinese $3^{rd}$ Office Action (w/English Translation) dated Nov. 7, 2013 corresponding to Chinese Application No. 200980106535.4; 9 Pages.
Chinese Notice of Allowance (w/English Translation) dated Mar. 7, 2014 corresponding to Chinese Application No. 200980106535.4; 8 Pages.
Chinese Office Action (w/English Translation) dated Aug. 29, 2012 corresponding to Chinese Application No. 200980106535.4; 8 Pages.
Demierre et al., "Reference Magnetic Actuator for Self-Calibration of a Very Small Hall Sensor Array;" Sensors and Actuators A 97-98; Apr. 2002; pp. 39-46; 8 Pages.
English Translation of Report of Re-Examination before Appeal dated Nov. 28, 2016 for JP Appl. No. 2015-013206; 2 pages.
Frick et al., "CMOS Microsystem for AC Current Measurement with Galvanic Isolation;" IEEE Sensors Journal, vol. 3, No. 6; Dec. 2003; pp. 752-760; 9 Pages.
Government of India, Patent Office Examination Report dated Mar. 6, 2017; 8 pages.
Halg, "Piezo-Hall Coefficients of n-Type Silicon;" Journal of Applied Physics, vol. 64, No. 1; Jul. 1, 1988; pp. 276-282; 7 Pages.
Hosticka, "CMOS Sensor Systems;" Sensors and Actuators A 66; Apr. 1998; pp. 335-341; 7 Pages.
Invitation to pay fees and Partial Search Report dated Jul. 10, 2017 for PCT Application No. PCT/US2017/029588, 15 pages.
Japanese $2^{nd}$ Office Action (English Translation Only) dated Nov. 28, 2013 corresponding to Japanese Application No. 2010-547666; 2 Pages.
Japanese $3^{rd}$ Office Action (w/English Translation) dated Sep. 29, 2014 corresponding to Japanese Application No. 2010-547666; 8 Pages.
Japanese Notice of Allowance (w/Reporting Letter & Allowed Claims in English) dated May 25, 2015 corresponding to Japanese Application No. 2010-547666; 9 Pages.
Japanese Office Action (English Translation Only) dated Apr. 4, 2013 corresponding to Japanese Application No. 2010-547666; 4 Pages.
Kammerer et al., "A Hall effect sensors network insensitive to mechanical stress;" Proceedings of IEEE Sensors, vol. 3; Oct. 2004; pp. 1071-1074; 4 Pages.
Kanda et al., "The Piezo-Hall Effect in n-Silicon;" Proceedings of the $22^{nd}$ International Conference on the Physics of Semiconductors, vol. 1; Jan. 1995; pp. 89-92; 4 Pages.
Korean Notice of Allowance (w/English Translation) dated Apr. 20, 2015 corresponding to Korean Application No. 10-2010-7019498; 3 Pages.

(56) References Cited

OTHER PUBLICATIONS

Korean Notice of Allowance (w/English Translation) dated Jul. 31, 2015 corresponding to Korean Application No. 10-2014-7033792; 5 Pages.
Korean Office Action (w/English Translation) dated Jan. 30, 2015 corresponding to Korean Application No. 10-2014-7033792; 6 Pages.
Korean Office Action (with English Translation) dated Sep. 30, 2013 corresponding to Korean Application No. 10-2010-7019498; 10 Pages.
Letter from Japanese Associate dated Sep. 27, 2016 indicating Notice of Appeal filed in Japan and enclosing a copy of Current Claims dated Aug. 29, 2016; for Japanese Patent Application No. 2015-013206; 3 pages.
Letter from Shardul Amarchand Mangaldas dated Sep. 15, 2017 for Indian Pat. Appl. No. 2318/KOLNP/2010; 1 page.
Letter from Yuasa and Hara dated Dec. 14, 2016 regarding Appeal for JP Pat Appl. No. 2015-013206; 3 pages.
Letter to Yuasa and Hara dated Feb. 17, 2017 for JP Pat. Appli. No. 2015-013206; 3 pages.
Magnani et al., "Mechanical Stress Measurement Electronics Based on Piezo-Resistive and Piezo-Hall Effects;" Proceedings of the $9^{th}$ International Conference on Electronics, Circuits and Systems, vol. 1; Dec. 2002; pp. 363-366; 4 Pages.
Manic et al., "Short and Long-Term Stability Problems of Hall Plates in Plastic Packages;" IEEE $38^{th}$ Annual International Reliability Physics Symposium; Apr. 2000; pp. 225-230; 6 Pages.
Manic, "Drift in Silicon Integrated Sensors and Circuits Due to the Thermo-Mechanical Stresses;" Lausanne, École Polytechnique Fédérale De Lausanne 2000; Part 1 of 2; 74 Pages.
Manic, "Drift in Silicon Integrated Sensors and Circuits Due to the Thermo-Mechanical Stresses;" Lausanne, École Polytechnique Fédérale De Lausanne 2000; Part 2 of 2; 102 Pages.
Motz et al., "A Chopped Hall Sensor with Small Jitter and Programmable "True Power-On" Function;" IEEE Journal of Solid-State Circuits, vol. 40, No. 7; Jul. 2005; pp. 1533-1540; 8 Pages.
Motz et al., "An Integrated Hall Sensor Platform Design for Position, Angle and Current Sensing;" IEEE Sensors 2006; Oct. 22-25, 2006; pp. 1008-1011; 4 Pages.
Motz et al., "An Integrated Magnetic Sensor with Two Continuous-Time $\Delta\Sigma$-Converters and Stress Compensation Capability;" IEEE International Solid-State Circuits Conference; Digest of Technical Papers; Feb. 6, 2006; pp. 1151-1160; 7 Pages.
Munter, "A Low-offset Spinning-current Hall Plate;" Sensors and Actuators A21-A23; Jan. 1990; pp. 743-746; 4 Pages.
Munter, "Electronic Circuitry for a Smart Spinning-current Hall Plate with Low Offset;" Sensors and Actuators A 25-27; Jun. 1991; pp. 747-751; 5 Pages.
Notice of Allowance dated Jun. 27, 2011 for U.S. Appl. No. 12/959,672; 8 Pages.
Notice of Allowance dated Nov. 3, 2010 for U.S. Appl. No. 12/037,393; 7 Pages.
Office Action dated Feb. 2, 2011 for U.S. Appl. No. 12/959,672; 13 Pages.
Office Action dated Jun. 30, 2010 for U.S. Appl. No. 12/037,393; 21 Pages.
Partin et al., "Temperature Stable Hall Effect Sensors;" IEEE Sensors Journal, vol. 6, No. 1; Feb. 2006; pp. 106-110; 5 Pages.
Pastre et al., "A Hall Sensor Analog Front End for Current Measurement with Continuous Gain Calibration;" IEEE Sensors Journal, vol. 7, No. 5; May 2007; pp. 860-867; 8 Pages.
Pastre et al., "A Hall Sensor-Based Current Measurement Microsystem With Continuous Gain Calibration;" Proceedings of IEEE Research in Microelectronics and Electronics, vol. 2; Jul. 25, 2005; pp. 95-98; 4 Pages.
PCT International Preliminary Report dated Sep. 1, 2011 for International Application No. PCT/US2010/024256; 9 Pages.
PCT International Preliminary Report dated Sep. 10, 2010 for International Application No. PCT/US2009/031776; 10 Pages.

PCT International Search Report and Written Opinion dated Aug. 11, 2010 for International Application No. PCT/US2010/024256; 14 Pages.
PCT International Search Report and Written Opinion dated Oct. 23, 2009 for International Application No. PCT/US2009/031776; 16 Pages.
Popovic, "Sensor Microsystems;" Proceedings of the $20^{th}$ International Conference on Microelectronics (MIEL 95), vol. 2; Sep. 12-14, 1995; pp. 531-537; 7 Pages.
Randhawa, "Monolithic Integrated Hall Devices in Silicon Circuits;" Microelectronics Journal, vol. 12, No. 6; Sep. 14-17, 1981; pp. 24-29; 6 Pages.
Response (w/English Translation) to Korean Office Action dated Jan. 30, 2015 corresponding to Korean Application No. 10-2014-7033792; Response filed on Mar. 23, 2015; 11 Pages.
Response (w/English Translation) to Korean Office Action dated Sep. 30, 2013 corresponding to Korean Application No. 10-2010-7019498; Response filed on Dec. 1, 2014; 32 Pages.
Response (w/Reporting Letter) to Chinese $2^{nd}$ Office Action dated Apr. 15, 2013 corresponding to Chinese Application No. 200980106535.4; Response filed on Jul. 11, 2013; 13 Pages.
Response (w/Reporting Letter) to Chinese $3^{rd}$ Office Action dated Nov. 7, 2013 corresponding to Chinese Application No. 200980106535.4; Response filed on Jan. 7, 2014; 11 Pages.
Response (w/Reporting Letter) to Chinese Office Action dated Aug. 29, 2012 corresponding to Chinese Application No. 200980106535.4; Response filed on Jan. 19, 2013; 13 Pages.
Response (w/Reporting Letter) to Japanese $2^{nd}$ Office Action dated Nov. 28, 2013 corresponding to Japanese Application No. 2010-547666; Response filed on Feb. 28, 2014; 12 Pages.
Response (w/Reporting Letter) to Japanese $3^{rd}$ Office Action dated Sep. 29, 2014 corresponding to Japanese Application No. 2010-547666; Response filed on Jan. 27, 2015; 6 Pages.
Response (w/Reporting Letter) to Japanese Office Action dated Apr. 4, 2013 corresponding to Japanese Application No. 2010-547666; Response filed on Jul. 3, 2013; 8 Pages.
Response to Office Action dated Feb. 2, 2011 for U.S. Appl. No. 12/959,672; Response filed on May 24, 2011; 8 Pages.
Response to Office Action dated Jun. 30, 2010 for U.S. Appl. No. 12/037,393; Response filed on Oct. 14, 2010; 34 Pages.
Response to Restriction Requirement dated May 14, 2010 for U.S. Appl. No. 12/037,393; Response filed on Jun. 2, 2010; 1 Pages.
Response to the First Examination Report filed on Sep. 6, 2017 for Indian Pat. Appl. No. 2318/KOLNP/2010; 37 pages.
Restriction Requirement dated May 14, 2010 for U.S. Appl. No. 12/037,393; 6 Pages.
Ruther et al., "Integrated CMOS-Based Sensor Array for Mechanical Stress Mapping;" $5^{th}$ IEEE Sensors Conference; Oct. 22-25, 2007; pp. 1131-1134; 4 Pages.
Ruther et al., "Thermomagnetic Residual Offset in Integrated Hall Plates;" IEEE Sensors Journal, vol. 3, No. 6; Dec. 2003; pp. 693-699; 7 Pages.
Schneider et al., "Temperature Calibration of CMOS Magnetic Vector Probe for Contactless Angle Measurement System;" Proceedings of the 1996 IEEE; Jan. 1996; pp. 533-536; 4 Pages.
Schott et al., "CMOS Single-Chip Electronic Compass with Microcontroller;" IEEE Journal of Solid-State Circuits, vol. 42, No. 12; Dec. 2007; pp. 2923-2933; 11 Pages.
Schott et al., "Linearizing Integrated Hall Devices;" International Conference on Solid-State Sensors and Actuators (Transducers'97); Jun. 16-19, 1997; pp. 393-396; 4 Pages.
Search Report and Written Opinion dated Oct. 4, 2017 for PCT Application No. PCT/US2017/029588; 23 pages.
Second Notice of Allowance dated Feb. 11, 2011 for U.S. Appl. No. 12/037,393; 8 Pages.
Second Notice of Allowance dated Jul. 19, 2011 for U.S. Appl. No. 12/959,672; 8 Pages.
Simon et al., "Autocalibration of Silicon Hall Devices;" $8^{th}$ International Conference on Solid-State Sensors and Actuators, and Eurosensors Ix (Transducers '95—Eurosensors IX), vol. 2; Jun. 25-29, 1995; pp. 237-240; 4 Pages.

(56) References Cited

OTHER PUBLICATIONS

Steiner et al., "Offset Reduction in Hall Devices by Continuous Spinning Current Method;" Sensors and Actuators A 66; Jan. 1998; pp. 167-172; 6 Pages.
Steiner et al., "Double-Hall Sensor with Self-Compensated Offset;" International Electron Devices Meeting (IEDM); Dec. 7, 1997; pp. 911-914; 4 Pages.
Stellrecht et al., "Characterization of Hygroscopic Swelling Behavior of Mold Compounds and Plastic Packages;" IEEE Transactions on Components and Packaging Technologies, vol. 27, No. 3; Sep. 2004; pp. 499-506; 8 Pages.
Tian et al., "Multiple Sensors on Pulsed Eddy-Current Detection for 3-D Subsurface Crack Assessment;" IEEE Sensors Journal, vol. 5, No. 1; Feb. 2005; pp. 90-96; 7 Pages.
Translation of Current Claims on file (as amended on Aug. 29, 2016) for JP 2015-013206; 2 pages.
Trontelj et al., "CMOS Integrated Magnetic Field Source Used as a Reference in Magnetic Field Sensors on Common Substrate;" Proceedings of IMTC Conference; May 10-12, 1994; pp. 461-463; 3 Pages.
Zou et al., "Three-Dimensional Die Surface Stress Measurements in Delaminated and Non-Delaminated Plastic Packages;" 48th Electronic Components and Technology Conference; May 25, 1998; pp. 1223-1234; 12 Pages.
U.S. Non-Final Office Action dated Nov. 17, 2017 for U.S. Appl. No. 15/161,553; 34 pages.
Response to U.S. Non-Final Office Action dated Nov. 17, 2017 for U.S. Appl. No. 15/161,553; Response filed Feb. 9, 2018; 10 pages.
U.S. Final Office Action dated Mar. 22, 2018 for U.S. Appl. No. 15/161,553; 14 pages.
Response to U.S. Final Office Action dated Mar. 22, 2018 for U.S. Appl. No. 15/161,553; Response filed Jun. 19, 2018; 10 pages.
Notice of Allowance dated Aug. 13, 2018 for U.S. Appl. No. 15/161,553; 15 pages.
Office Action dated Sep. 10, 2019 for German Application No. 112009000448.2 with English Translation; 23 Pages.
Response to German Office Action with English machine translation dated Jan. 17, 2020 for German Application No. 112009000448.2; 26 pages.
Intention to Grant dated May 28, 2020 for European Application No. 17722302.1; 7 pages.
Japanese Office Action with English translation dated Dec. 24, 2015 for Japanese Application No. 2015-013206; 6 pages.
Response to Japanese Office Action with English translation filed on Mar. 17, 2016 for Japanese Application No. 2015-013206; 10 pages.
Japanese Office Action with English translation dated Jun. 7, 2016 for Japanese Application No. 2015-013206; 5 pages.
Request for Appeal filed on Aug. 29, 2016 for Japanese Application No. 2015-013206; 12 pages.
Notice of Hearing dated Sep. 17, 2020 For Indian Application No. 2318/KOLNP/2010; 3 pages.
Written Submission Pursuant to Official Hearing filed on Nov. 6, 2020 for Indian Application No. 2318/KOLNP/2010; 59 pages.
U.S. Non-Final Office Action dated Jun. 11, 2020 for U.S. Appl. No. 16/160,132; 13 Pages.
U.S. Final Office Action dated Aug. 6, 2020 for U.S. Appl. No. 16/160,132; 18 Pages.
Response to U.S. Non-Final Office Action dated Jun. 11, 2020 for U.S. Appl. No. 16/160,132; Response filed Jul. 15, 2020; 9 Pages.
Response to U.S. Final Office Action dated Aug. 6, 2020 for U.S. Appl. No. 16/160,132; Response filed Oct. 28, 2020; 7 Pages.
Notice of Allowance dated Nov. 25, 2020 for U.S. Appl. No. 16/160,132; 9 Pages.
Extended European Search Report dated Apr. 29, 2021 for European Application No. 20206805.2; 7 Pages.
Response to communication dated Dec. 12, 2018 for Application No. 17722302.1; Response filed Jun. 24, 2019; 5 Pages.
Notice of Decision to Grant dated Oct. 15, 2020 for Application No. 17722302.1; 2 Pages.

Allegro MicroSystems, LLC, "Chopper-Stabilized Precision Hall-Effect Switch with Advanced Diagnostics;" A1160 Data Sheet, Rev. 3; Feb. 4, 2020; 13 Pages.
Allegro MicroSystems, LLC, "Programmable Linear Hall IC with Advanced Diagnostics for Safety-Critical Applications;" A1342 Data Sheet, Rev. 2; Jan. 25, 2019; 48 Pages.
Allegro MicroSystems, LLC, "Programmable Linear Hall IC with Advanced Diagnostics for Safety-Critical Applications;" A1346 Data Sheet, Rev. 5; Dec. 16, 2019; 52 Pages.
Blagojevic et al.; "FD SOI Hall Sensor Electronics Interfaces for Energy Measurement;" Microelectronics Journal 37; Sep. 2006; pp. 1576-1583; 8 Pages.
Cesaretti et al., "Effect of Stress Due to Plastic Package Moisture Absorption in Hall Sensors;" IEEE Transactions on Magnetics, vol. 45, No. 16; Oct. 2009; pp. 4482-4485; 4 Pages.
Kayal et al.; "Automatic Calibration of Hall Sensor Microsystems;" Microelectronics Journal 37; Sep. 2006; pp. 1569-1575; 7 Pages.
Sargent; "Switched-capacitor IC controls feedback loop;" EDN; Design Ideas; Feb. 17, 2000; pp. 154 and 156; 2 Pages.
Wu, et al.; "A Chopper Current-Feedback Instrumentation Amplifier with a 1mHz 1/fNoise Corner and an AC-Coupled Ripple-Reduction Loop;" IEEE International Solid-State Circuits Conference; Feb. 10, 2009; pp. 322-324; 3 Pages.
German Office Action (with English Translation) dated Sep. 23, 2013 for German Application No. 112010000848.5; 12 Pages.
Response (with Amended English Claims & Reporting Letter from FA) to German Office Action dated Sep. 23, 2013 for German Application No. 112010000848.5; Response filed May 26, 2014; 50 Pages.
U.S. Non-Final Office Action dated Jul. 6, 2012 for U.S. Appl. No. 12/706,318; 29 Pages.
Response to U.S. Non-Final Office Action dated Jul. 6, 2012 for U.S. Appl. No. 12/706,318; Response filed Sep. 27, 2012; 12 Pages.
Supplemental Response to U.S. Non-Final Office Action dated Jul. 6, 2012 for U.S. Appl. No. 12/706,318; Response filed Oct. 2, 2012; 12 pages.
U.S. Notice of Allowance; dated Dec. 10, 2012; for U.S. Appl. No. 12/706,318; 9 pages.
U.S. Non-Final Office Action dated Jun. 12, 2013 for U.S. Appl. No. 13/743,451; 24 pages.
Response to U.S. Non-Final Office Action dated Jun. 12, 2013 for U.S. Appl. No. 13/743,451; Response filed Oct. 8, 2013; 12 pages.
U.S. Notice of Allowance dated Dec. 24, 2013 for U.S. Appl. No. 13/743,451; 24 pages.
312 Amendment filed Feb. 11, 2014 for U.S. Appl. No. 13/743,451; 7 Pages.
Response to Rule 312 Amendment dated Mar. 21, 2014 for U.S. Appl. No. 13/743,451; 2 Pages.
Preliminary Amendment dated Mar. 7, 2012 for U.S. Pat. U.S. Appl. No. 12/840,324; 7 pages.
U.S. Non-Final Office Action dated Sep. 11, 2012; U.S. Appl. No. 12/840,324; 17 pages.
Response to U.S. Non-Final Office Action dated Sep. 11, 2012 for U.S. Appl. No. 12/840,324; Response filed Dec. 11, 2012; 15 pages.
U.S. Final Office Action dated Feb. 12, 2013 for U.S. Appl. No. 12/840,324; 19 pages.
Response to U.S. Final Office Action dated Feb. 12, 2013 for U.S. Appl. No. 12/840,324; Response filed May 13, 2013; 12 pages.
U.S. Notice of Allowance dated May 24, 2013 for U.S. Appl. No. 12/840,324; 12 pages.
PCT International Search Report and Written Opinion dated Sep. 27, 2010 for International Application No. PCT/US2010/042694; 16 Pages.
PCT International Preliminary Report of the ISA dated Feb. 2, 2012 for International Application No. PCT/US2010/042694; 11 Pages.
European Rule 161/162 Communication dated Feb. 23, 2012 for European Appl. No. 10739429.8; 2 Pages.
Response to European Rule 161/162 Communication dated Feb. 23, 2012 and Written Opinion for European Appl. No. 10739429.8; Response filed Sep. 4, 2012; 11 Pages.

(56) References Cited

OTHER PUBLICATIONS

European Intention to Grant dated Jan. 4, 2013 for European Pat. Appl. No. 10 739 429.8; 5 Pages.
Extended European Search Report dated Jul. 4, 2013 for EP Pat. Appl. No. 13169661.9; 11 pages.
Response to Extended European Search Report dated Jul. 4, 2013 for EP Pat. Appl. No. 13169661.9; Response filed Mar. 4, 2014; 18 pages.
European Intention to Grant dated Aug. 14, 2014 for EP Pat. Appl. No. 13169661.9; 5 pages.
Voluntary Amendment (with English Translation and FA Reporting Letter) filed Jun. 12, 2013 for Japanese Application No. 2012-521746; 11 Pages.
Japanese Office Action (with English Translation) dated Mar. 4, 2014 for Japanese Application No. 2012-521746; 4 Pages.
Response (with Machine English Translation) to Japanese Office Action dated Mar. 4, 2014 for Japanese Application No. 2012-521746; Response filed Jul. 3, 2014; 8 Pages.
Japanese Decision to Grant (with Machine English Translation) dated Aug. 19, 2014 for Japanese Application No. 2012-521746; 4 Pages.
Korean Voluntary Amendment (with Machine English Translation) filed Apr. 17, 2015 for Korean Application No. 10-2012-7004427; 6 Pages.
Korean Office Action (with English Translation) dated May 17, 2016 for Korean Application No. 10-2012-7004427; 19 Pages.
Response to Korean Office Action (with Machine English Translation) dated May 17, 2016 for Korean Application No. 10-2012-7004427; Response filed Jul. 15, 2016; 54 Pages.
Korean Notice of Allowance (with English Translation) dated Sep. 22, 2016 for Korean Application No. 10-2012-7004427; 3 Pages.
U.S. Non-Final Office Action dated Jan. 9, 2015 for U.S. Appl. No. 14/321,347; 6 Pages.
Response to U.S. Non-Final Office Action dated Jan. 9, 2015 for U.S. Appl. No. 14/321,347; Response filed Apr. 29, 2015; 9 Pages.
U.S. Notice of Allowance dated Jun. 1, 2015 for U.S. Appl. No. 14/321,347; 10 Pages.
German Decision to Grant (with Reporting Letter from FA dated Dec. 20, 2017) dated Dec. 14, 2017 for German Application No. 112010000848.5; 9 Pages.
U.S. Notice of Allowance dated Nov. 14, 2013 for U.S. Appl. No. 13/969,702; 12 pages.
U.S. Notice of Allowance dated Sep. 23, 2021 for U.S. Appl. No. 16/826,451; 9 Pages.

\* cited by examiner

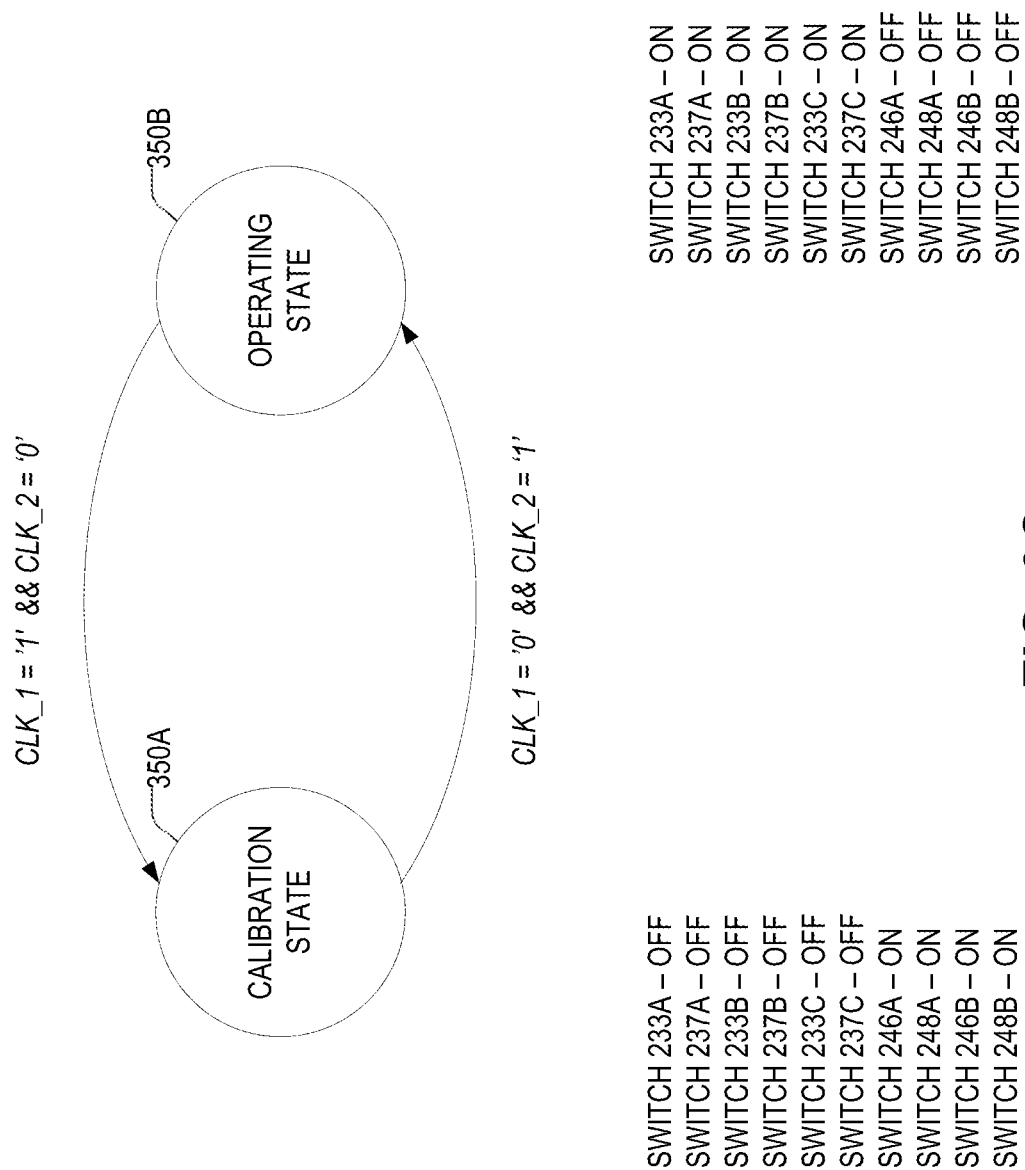

CHANNEL SENSITIVITY MATCHING

BACKGROUND

As is known, sensors are used to perform various functions in a variety of applications. Some sensors include one or more magnetic field sensing elements, such as a Hall effect element or a magnetoresistive element, to sense a magnetic field associated with proximity or motion of a target object, such as a ferromagnetic object in the form of a gear or ring magnet, or to sense a current, as examples. Sensor integrated circuits are widely used in automobile control systems and other safety critical applications. There are a variety of specifications that set forth requirements related to permissible sensor quality levels, failure rates, and overall functional safety.

SUMMARY

According to aspects of the disclosure, a sensor is provided comprising: a reference magnetic field generator configured to generate a reference magnetic field that is modulated at a first frequency; a first magnetic field sensing element that is configured to generate a first internal signal that is modulated at a second frequency; a second magnetic field sensing element that is configured to generate a second internal signal that is modulated at the second frequency; a first amplifier configured to receive the first internal signal and output a first amplified signal; a second amplifier configured to receive the second internal signal and output a second amplified signal; a gain adjustment circuit configured to: generate a difference signal by subtracting the first amplified signal from the second amplified signal, demodulate the difference signal at the first frequency and the second frequency to produce a gain adjustment signal, and adjust a gain of at least one of the first amplifier and the second amplifier based on the gain adjustment signal.

According to aspects of the disclosure, a sensor is provided comprising: a first amplifier configured to receive a first internal signal and output a first amplified signal, the first internal signal being generated by a first magnetic field sensing element, the first internal signal being generated, at least in part, in response to a reference magnetic field that is modulated at a first frequency, the first internal signal being modulated at a second frequency; a second amplifier configured to receive a second internal signal and output a second amplified signal, the second internal signal being generated by a second magnetic field sensing element, the second internal signal being generated, at least in part, in response to the reference magnetic field that is modulated at the first frequency, the second internal signal being modulated at the second frequency; a gain adjustment circuit configured to: generate a difference signal by subtracting the first amplified signal from the second amplified signal, demodulate the difference signal at the first frequency and the second frequency to produce a gain adjustment signa, and adjust a gain of at least one of the first amplifier and the second amplifier based on the gain adjustment signal.

According to aspects of the disclosure, a sensor is provided comprising: a first amplifier configured to receive a first internal signal and output a first amplified signal, the first internal signal being generated by a first magnetic field sensing element, the first internal signal being generated, at least in part, in response to a reference magnetic field that is modulated at a first frequency, the first internal signal being modulated at a second frequency; a second amplifier configured to receive a second internal signal and output a second amplified signal, the second internal signal being generated by a second magnetic field sensing element, the second internal signal being generated, at least in part, in response to the reference magnetic field, the second internal signal being modulated at the second frequency; a gain adjustment circuit configured to: generate a difference signal by subtracting the first amplified signal from the second amplified signal, demodulate the difference signal at the first frequency and the second frequency to produce a gain adjustment signal; and a gain code generator that is configured to receive the gain adjustment signal, generate a gain code based on the gain adjustment signal, and adjust a gain of at least one of the first amplifier and the second amplifier.

BRIEF DESCRIPTION OF THE DRAWINGS

The foregoing features may be more fully understood from the following description of the drawings in which:

FIG. 3C is a state diagram illustrating the operation of the sensor of FIG. 3A, according to aspects of the disclosure;

DETAILED DESCRIPTION

Figure 1:
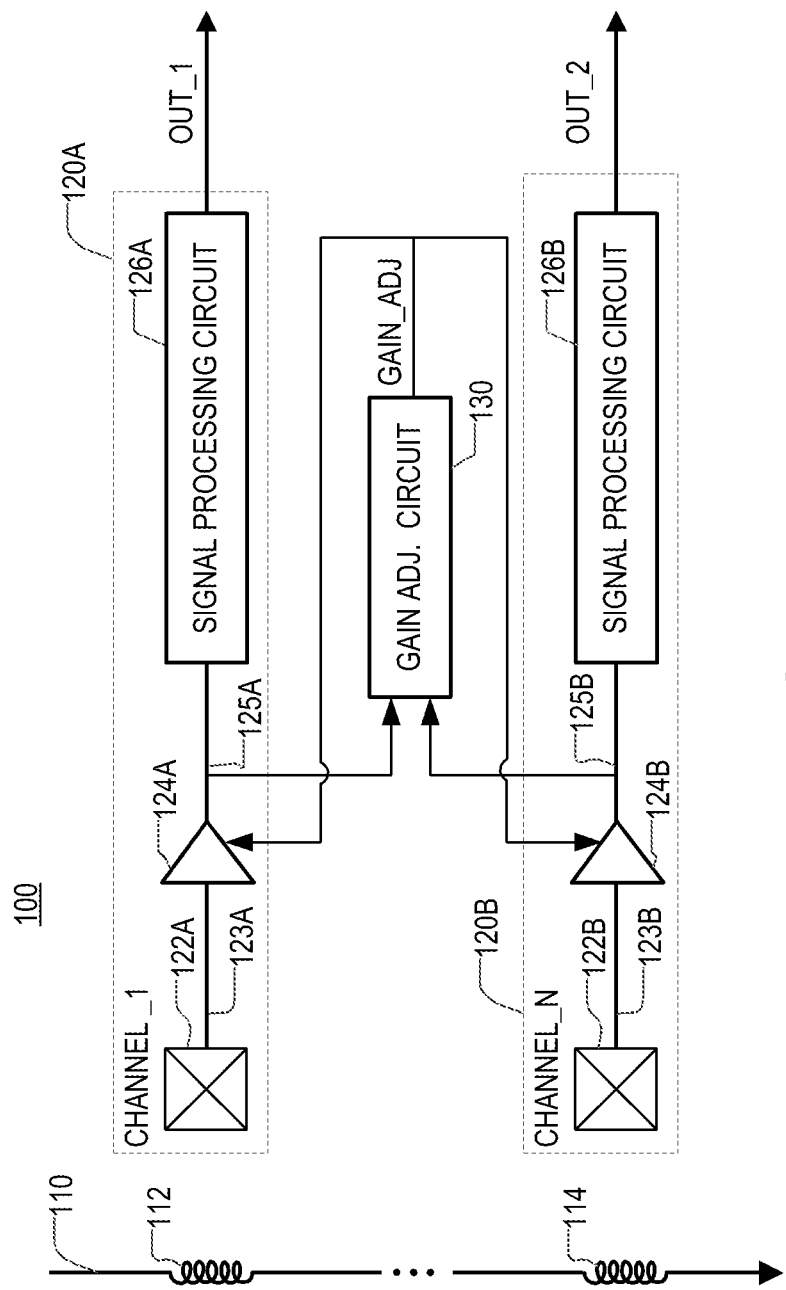
FIG. 1 is a diagram of an example of a sensor, according to aspects of the disclosure.

FIG. 1 is a diagram of an example of a sensor 100, according to aspects of the disclosure. The sensor 100 may include a magnetic field generator 110, a first channel 120A, a second channel 120B, and a gain adjustment circuit 130.

The magnetic field generator 110 may include a first coil 112 and a second coil 114. The first coil 112 may be disposed adjacent to a sensing unit 122A of the first channel 120A. The second coil 114 may be disposed adjacent to a sensing unit 122B of the second channel 120B.

The first channel 120A may include the sensing unit 122A, an amplifier 124A, and a signal processing circuit 126A. The sensing unit 122A may include one or more Hall elements. For example, the sensing unit 122A may include a chopper-stabilized bridge circuit (e.g., a Wheatstone bridge) that is formed of Hall elements. The sensing unit 122A may be configured to generate a signal 123A. The amplifier 124A may be configured to amplify the signal 123A to produce a signal 125A. The signal processing circuit 126A may be configured to process the signal 125A to produce an output signal OUT_1.

The second channel 120B may include a sensing unit 122B, an amplifier 124B, and a signal processing circuit 126B. The sensing unit 122B may include one or more Hall elements. For example, the sensing unit 122B may include a chopper-stabilized bridge circuit (e.g., a Wheatstone bridge) that is formed of Hall elements. The sensing unit 122B may be configured to generate a signal 123B. The amplifier 124B may be configured to amplify the signal 123B to produce a signal 125B. The signal processing circuit 126B may be configured to process the signal 125B to produce an output signal OUT_2.

The gain adjustment circuit 130 may be configured to correct for sensitivity mismatch between the sensing units 122A and 122B by adjusting the gain of at least one of the amplifiers 124A and 124B. More particularly, the gain adjustment circuit 130 may be configured generate a gain adjustment signal GAIN_ADJ based on a difference of the signals 125A and 125B. The gain adjustment signal GAIN_ADJ may be a differential signal having a first component and a second component. The first component of the gain adjustment signal GAIN_ADJ may be used to adjust the gain of the amplifier 124A and the second component of the gain adjustment signal GAIN_ADJ may be used to adjust the gain of the amplifier 124B. Although in the present example the gain adjustment signal GAIN_ADJ is a differential signal that is used to adjust the gain of both of amplifiers 124A and 124B, alternative implementations are possible in which the gain adjustment signal GAIN_ADJ is a single-ended signal and/or in which the gain adjustment signal GAIN_ADJ is used to adjust the gain of only one of amplifiers 124A and 124B. In some implementations, the operation of the signal processing circuits 126A and 126B may be staggered with the operation of the magnetic field generator 110 and the gain adjustment circuit 130, such that: (i) the signal processing circuits 126A and 126B are inactive when the magnetic field generator 110 and the gain adjustment circuit 130 are active, and (ii) the signal processing circuits 126A and 126B are active when the magnetic field generator 110 and the gain adjustment circuit 130 are inactive.

Although in the example of FIG. 1 the sensor 100 includes two channels, it will be understood that alternative implementations are possible in which the sensor 100 includes any number of channels. Although in the example of FIG. 1 the magnetic field generator 110 includes two coils, alternative implementations are possible in which the magnetic field generator 110 includes any number of coils. In some implementations, each of the coils in the magnetic field generator may be disposed adjacent to a different sensing unit that is part of the sensor 100.

Additional examples of the concept illustrated by FIG. 1 are discussed further below with respect to FIGS. 2A-4C.

Figure 2A:
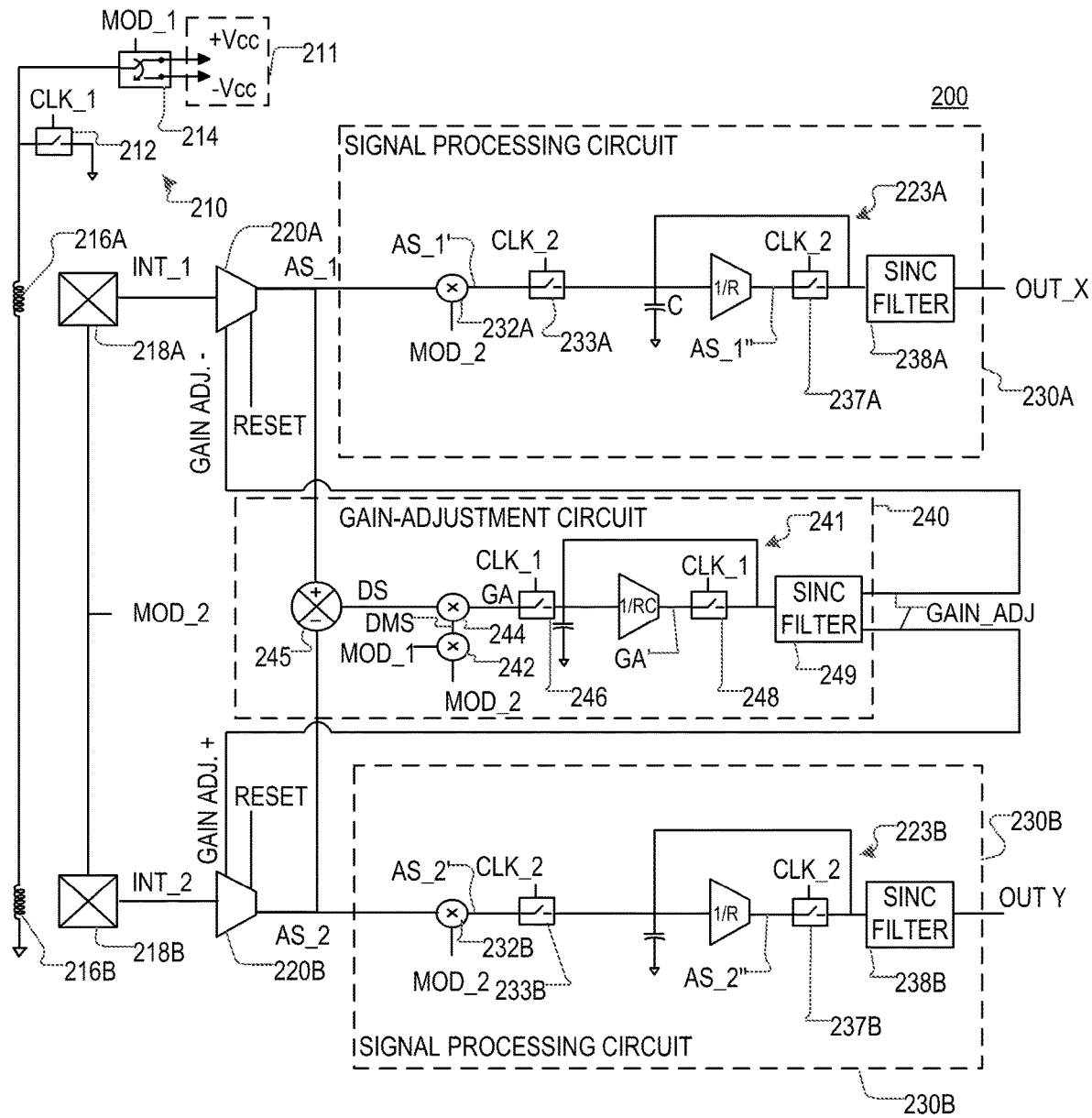
FIG. 2A is a diagram of an example of a sensor, according to aspects of the disclosure.

FIG. 2A is a diagram of an example of a sensor 200, according to aspects of the disclosure. The sensor 200 may include a magnetic field generator 210, a first Hall-effect sensing unit 218A, a second Hall-effect sensing unit 218B, amplifiers 220A-B, signal processing circuits 230A-B, and a gain adjustment circuit 240.

The magnetic field generator 210 may include a switch 212, a modulator 214, a first coil 216A, and a second coil 216B. The magnetic field generator 210 may be coupled to a voltage source 211 and it may be configured to generate a reference magnetic field. The modulator 214 may modulate the reference magnetic field based on a signal MOD_1 by varying the polarity of the voltage source 211. The modulator 214 may invert the coil sign every chopping period of the Hall-effect sensing units 218A-B in order to have the reference magnetic field modulated at half the chopping frequency of the Hall-effect sensing units 218A-B.

The first Hall-effect sensing unit 218A may include one or more Hall elements. According to one example, the first Hall-effect sensing unit 218A may include a chopper-stabilized bridge circuit (e.g., a Wheatstone bridge) that is formed of Hall elements. The first Hall-effect sensing unit 218A may be configured to generate a first internal signal INT_1, which is modulated based on a signal MOD_2. Chopper stabilization is a well-known technique that cancels the mismatching of the bridge circuit by changing the direction of the current that is flowing across the bridge circuit. For instance, when the signal MOD_2 is high, the current may flow in one direction. On the other hand, when the signal MOD_2 is low, the current may flow in the opposite direction. It will be understood that the present disclosure is not limited any specific technique for chopper stabilization. The term chopping frequency, as used in any of the examples of FIGS. 2A-4C, refers the frequency of the signal MOD_2 (shown in FIGS. 2B, 3B, and 4B).

The first amplifier 220A may include a transconductance amplifier. However, alternative implementations are possible in which the first amplifier 220A includes another type of amplifier. In operation, the first amplifier 220A may be configured to amplify the first internal signal INT_1 to produce a first amplified signal AS_1.

The signal processing circuit 230A may include a modulator 232A, a low-pass filter 223A, and a sinc filter 238A. The modulator 232A may be configured to demodulate the first amplified signal AS_1 at the chopping frequency MOD_2 to produce a demodulated signal AS_1'. The low-pass filter 223A may include a capacitor having a capacitance C and an amplifier having internal transconductance 1/R, as shown. The low-pass filter may filter the demodulated signal AS_1' to produce a filtered signal AS_1". The sine filter 238A may be configured to filter the signal AS_1" to produce an output signal OUT_X.

The second Hall-effect sensing unit 218B may include one or more Hall elements. According to one example, the second Hall-effect sensing unit may include a chopper-stabilized bridge circuit (e.g., a Wheatstone bridge) that is formed of Hall elements. The second Hall-effect sensing unit 218B may be configured to generate a second internal signal INT_2, which is modulated based on a signal MOD_2.

The second amplifier 220B may include a transconductance amplifier. However, alternative implementations are possible in which the second amplifier 220B includes another type of amplifier. In operation, the second amplifier 220B may be configured to amplify the second internal signal INT_2 to produce a second amplified signal AS_2.

The signal processing circuit 230B may include a modulator 232B, a low-pass filter 223B, and a sine filter 238B. The modulator 232B may be configured to demodulate the second amplified signal AS_2 at the chopping frequency MOD_2 to produce a demodulated signal AS_2'. The low-pass filter 223B may include a capacitor having a capacitance C, and an amplifier having internal transconductance 1/R, as shown. The low-pass filter may filter the demodulated signal AS_2' to produce a filtered signal AS_2". The sine filter 238B may be configured to filter the signal AS_2" to produce an output signal OUT_Y.

The gain adjustment circuit 240 may include a subtraction element 245, a modulator 242, a modulator 244, a low-pass filter 241, and a sine filter 249. The subtraction element 245 may be configured to produce a difference signal DS by subtracting the second amplified signal AS_2 from the first amplified signal AS_1. The modulator 242 may demodulate a signal MOD_1 based on the signal MOD_2 to produce a demodulated signal DMS. The modulator 244 may demodulate the difference signal DS based on the demodulated signal DMS to produce a signal GA. The low-pass filter 241 may filter the signal GA to produce a signal GA'. The signal GA' may be subsequently filtered by the sine filter 249 to produce the gain adjustment signal GAIN_ADJ.

The gain adjustment signal GAIN_ADJ may be a differential signal having a first component GAIN_ADJ+ and a second component GAIN_ADJ−. The first component GAIN_ADJ+ may be applied at a gain control terminal of the first amplifier 220A, and it may effectively set (or control) the gain of the first amplifier 220A. The second component GAIN_ADJ− may be applied at a gain control terminal of the second amplifier 220B, and it may effectively set (or control) the gain of the second amplifier 220B. Although in the example of FIG. 2A the gain adjustment signal is a differential signal, alternative implementations are possible in which the gain adjustment signal is a single-ended signal. In such implementations, the gain adjustment signal may be used to set the gain of only one of the amplifiers 220A and 220B.

The gain adjustment circuit 240 may be provided with switches 246 and 248. Switch 246 may be interposed between the modulator 244 and the low-pass filter 241. Switch 248 may be interposed between the low-pass filter 241 and the sinc filter 249. Each of switches 246 and 248 may be driven by a clock signal CLK_1. By way of example, when the clock signal CLK_1 is high, each of the switches 246 and 248 may be turned on. When the clock signal CLK_1 is low, each of the switches 246 and 248 may be turned off.

The signal processing circuit 230A may be provided with switches 233A and 237A. Switch 233A may be interposed between the modulator 232A and the low-pass filter 223A. Switch 237A may be interposed between the low-pass filter 223A and the sinc filter 238A. Each of switches 233A and 237A may be driven by a clock signal CLK_2. By way of example, when the clock signal CLK_2 is high, each of the switches 233A and 237A may be turned on. When the clock signal CLK_2 is low, each of the switches 233A and 237A may be turned off.

The signal processing circuit 230B may be provided with switches 233B and 237B. Switch 233B may be interposed between the modulator 232B and the low-pass filter 223B. Switch 237B may be interposed between the low-pass filter 223B and the sinc filter 238B. Each of switches 233B and 237B may be driven by a clock signal CLK_2. By way of example, when the clock signal CLK_2 is high, each of the switches 233B and 237B may be turned on. When the clock signal CLK_2 is low, each of the switches 233B and 237B may be turned off.

Figure 2B:
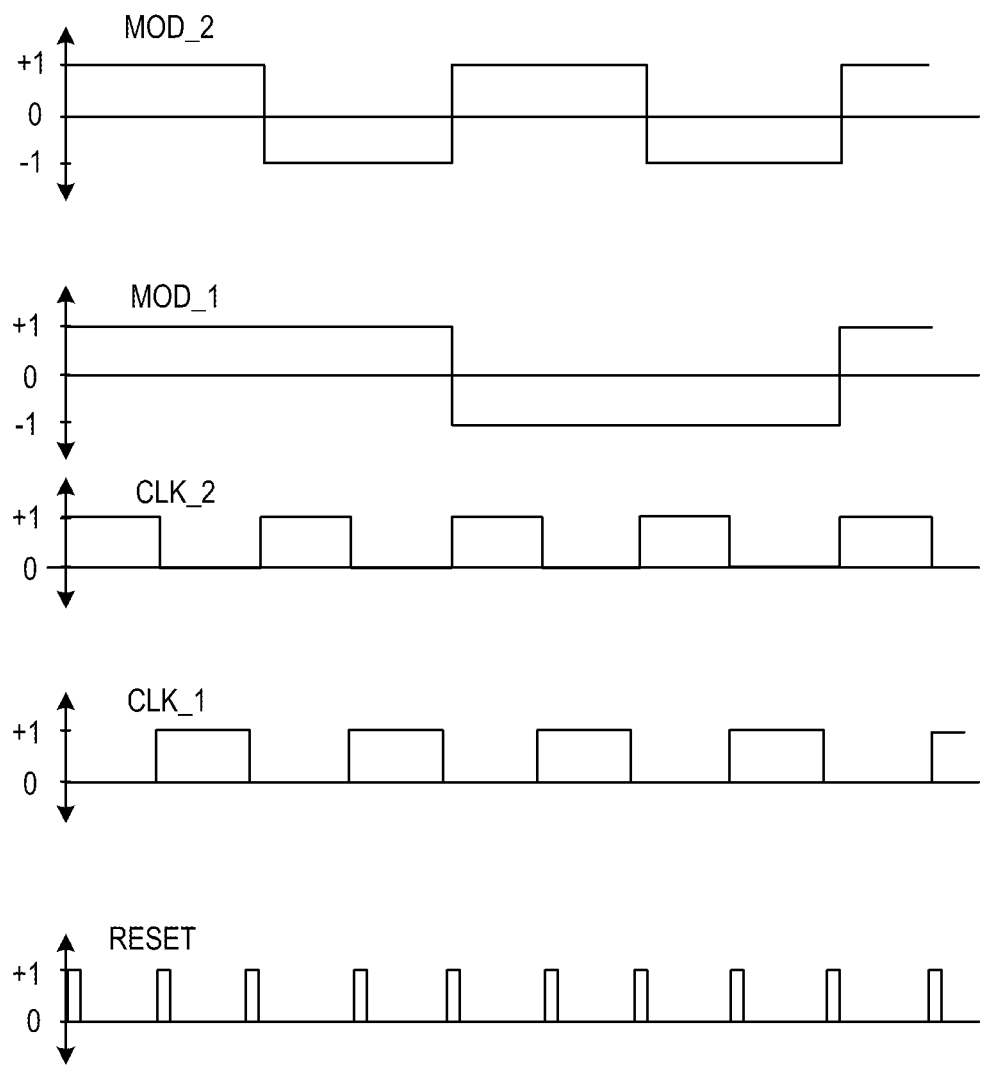
FIG. 2B is a plot of signals that drive the operation of components of the sensor of FIG. 2A.

According to the example of FIG. 2A, the magnetic field generator 210 and the gain adjustment circuit 240 are driven by a first clock signal CLK_1. The signal processing circuits 230A and 230B are driven by a second clock signal CLK_2. As illustrated in FIG. 2B, the first clock signal CLK_1 and the second clock signal CLK_2 are each other's inverse—when the first clock signal CLK_1 is high, the second clock signal CLK_2 is low, and vice versa. As a result of this arrangement, the signal processing circuits 230A and 230B are active when the gain adjustment circuit 240 is inactive, and the gain adjustment circuit 240 is active when the signal processing circuits 230A and 230B are inactive. Additionally or alternatively, in some implementations, signals CLK_1 and CLK_2 may have twice the frequency of signal MOD_2, and in each half-period of the signal MOD_2, signal CLK_1 may be set to logic-high for the same duration as the signal CLK_2.

According to the example of FIG. 2A, the reference magnetic field (generated by the magnetic field generator 210) is modulated based on a signal MOD_1, while the internal signal INT_1 and the internal signal INT_2 are modulated based on a signal MOD_2. As illustrated in FIG. 2B, the frequency of the signal MOD_2 is twice as large as the frequency of the signal MOD_1, such that a full period of the signal MOD_2 occurs each half-period of the signal MOD_1.

According to the example of FIG. 2A, the amplifiers 220A and 220B are reset every time the signals CLK_1 and CLK_2 transition from high to low, or from low to high. Resetting the amplifier 220A allows the amplifier 220A to have the same response for: (i) values of the signal INT_1 that are generated in response to the reference magnetic field and (ii) values of the signal INT_1 that are generated in response to an external magnetic field. Similarly, resetting the amplifier 220B allows the amplifier 220B to have the same response for: (i) values of the signal INT_2 that are generated in response to the reference magnetic field and (ii) values of the signal INT_2 that are generated in response to an external magnetic field. The reference magnetic field, as noted above, may be generated by the magnetic field generator 210. The external magnetic field, in some implementations, may include a magnetic field that is indicative of at least one of the position, speed, acceleration, or displacement of a target.

Figure 2C:
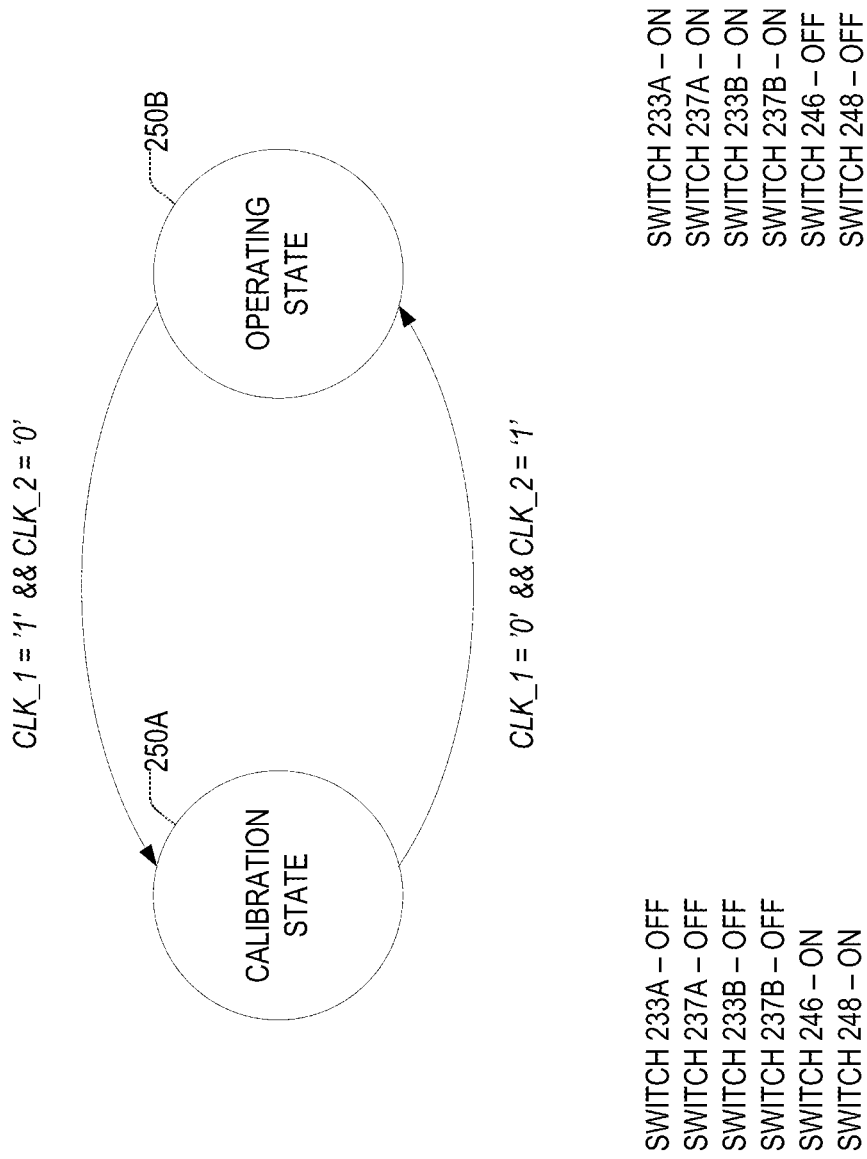
FIG. 2C is a state diagram illustrating the operation of the sensor of FIG. 2A, according to aspects of the disclosure.

FIG. 2C is a state diagram providing an example of one aspect of the operation of the sensor 200. As illustrated, at any given time of its operation, the sensor 200 may be in one of a calibration state 250A and an operating state 250B. When the sensor 200 is in the calibration state 250A: (i) the magnetic field generator 210 generates a reference magnetic field, (ii) the gain adjustment circuit generates a gain adjustment signal GAIN_ADJ based on the reference magnetic field, and (iii) the gain adjustment signal GAIN_ADJ is used to correct for any sensitivity mismatch between the Hall-effect sensing units 218A and 218B by controlling the gain of the amplifiers 220A and 220B. When the sensor 200 is in the operating state 250B: (i) the sensor 200 senses an external magnetic field, and (ii) generates output signals OUT_X and OUT_Y based on the external magnetic field.

According to the example of FIGS. 2A-B, the sensor 200 is a positional sensor, signal OUT_X indicates the x-coordinate of the position of a target, and signal OUT_Y indicates the y-coordinate of the position of the target. Although in the example of FIGS. 2A-C the sensor 200 is a positional sensor, alternative implementations are possible in which the sensor 200 is another type of sensor, such as a speed sensor for example. Although in the example of FIGS. 2A-C the sensing units 218A-B include Hall elements, alternative implementations are possible in which another type of magnetic field sensing element is used, such as a giant magnetoresistive element (GMR) or a tunnel magnetoresistive element (TMR).

When the sensor 200 is in the calibration state 250A, switch 233A may be turned off, switch 237A may be turned off, switch 233B may be turned off, switch 237B may be turned off, switch 246 may be turned on, and switch 248 may be turned on. When the sensor 200 is in the operating state 250B, switch 233A may be turned on, switch 237A may be turned on, switch 233B may be turned on, switch 237B may be turned on, switch 246 may be turned off and switch 248 may be turned off.

The transitions between the states 250A and 250B may be driven by the signals CLK_1 and CLK_2. Specifically, the sensor 200 may transition from the calibration state 250A to the operating state 250B when the signal CLK_1 changes from high to low, and the signal CLK_2 changes from low to high. Similarly, the sensor 200 may transition from the operating state 250B to the calibration state 250A when the signal CLK_1 changes from low to high, and the signal CLK_2 changes from high to low.

In some implementations, the sensor 200 may spend one half of each phase of the Hall-effect sensing units 218A and 218B in the calibration state 250A and the other half in the operating state 250B. As noted above, the signals output by the Hall-effect sensing units 218A and 218B are modulated by the signal MOD_2, whose waveform is shown in FIG. 2B. Each phase of the Hall-effect sensing units 218A and 218B may correspond to one continuous time period in which the signal MOD_2 is high or one continuous time period in which the signal MOD_2 is low.

In some implementations, each of the Hall-effect sensing units 218A and 218B may be disposed adjacent to a different coil of the magnetic field generator 210. More particularly, the Hall-effect sensing unit 218A may be disposed adjacent to the first coil 216A and the Hall-effect sensing unit 218B may be disposed adjacent to the second coil 216B.

In an alternative implementation, each of switches 237A, 237B, and 248 may be omitted, and/or replaced with a short. In such implementations, the amplifier (e.g., a transconductance amplifier) that is part of the signal processing circuit 230A may be coupled directly to the sinc filter 238A, the amplifier (e.g., a transconductance amplifier) that is part of the signal processing circuit 230B may be coupled directly to the sinc filter 238B, and the amplifier (e.g., a transconductance amplifier) that is part of the low-pass filter 241 may be coupled directly to the sinc filter 249. Under this arrangement, the amplifiers would be muted (set to 0) instead of being held. Muting the amplifiers may result in the bandwidth of the system being increased two times, and it may come at the cost of the gain of the system being reduced by the same factor.

In some implementations, the gain adjustment signal GAIN_ADJ may be used to detect failures of the signal processing circuit 230A and 230B. In this regard, it will be understood that the gain adjustment signal GAIN_ADJ may be used to achieve compliance with one or more Automotive Safety Integrity Level (ASIL) standards. For instance, in some implementations, a processing circuit (not shown) may monitor the value of the gain adjustment signal GAIN_ADJ and output an indication of an error when the signal GAIN_ADJ exceeds a predetermined threshold or falls outside of a predetermined range.

Figure 3A:
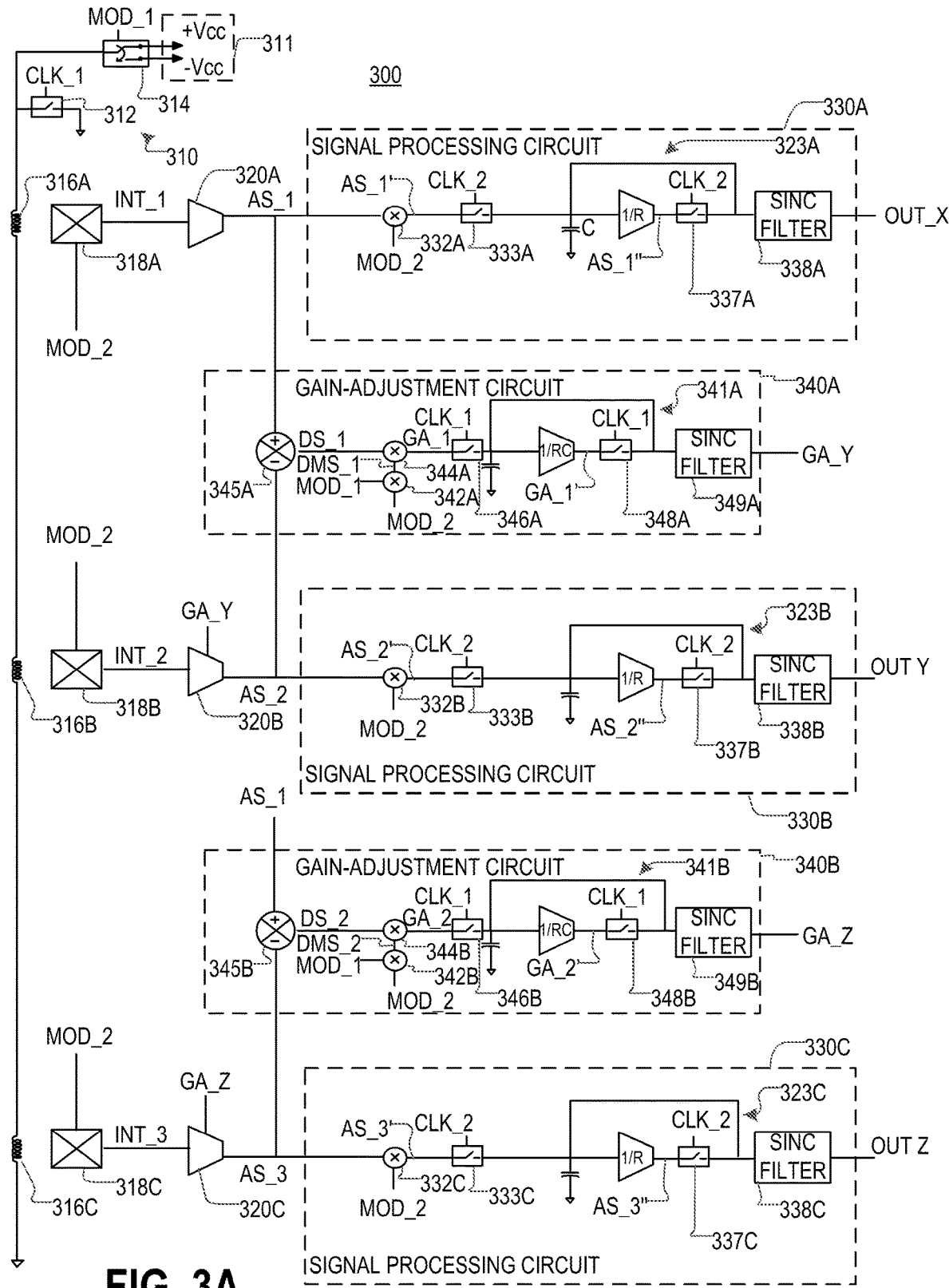
FIG. 3A is a diagram of an example of a sensor, according to aspects of the disclosure.

FIG. 3A is a diagram of an example of a sensor 300, according to aspects of the disclosure. The sensor 300 may include a magnetic field generator 310, a first Hall-effect sensing unit 318A, a second Hall-effect sensing unit 318B, a third Hall-effect sensing unit 318C, amplifiers 320A-C, signal processing circuits 330A-C, and gain adjustment circuits 340A-B. The sensor 300 differs from sensor 200 (shown in FIG. 2A) in that it includes one extra channel. In the example of FIG. 3A, each of amplifiers 320A-C belongs to a different channel. In the example of FIG. 3A, the gain of amplifiers 320B-C is adjusted to match the gain of amplifier 320A.

The magnetic field generator 310 may include a switch 312, a modulator 314, a first coil 316A, a second coil 316B, and a third coil 316C. The magnetic field generator 310 may be coupled to a voltage source 311 and it may be configured to generate a reference magnetic field. The modulator 314 may modulate the reference magnetic field based on a signal MOD_1 by varying the polarity of the voltage source 311. The modulator 314 may invert the coil sign every chopping period of the Hall-effect sensing units 318A-C in order to have the reference magnetic field modulated at half the chopping frequency of the Hall-effect sensing units 318A-C.

The first Hall-effect sensing unit 318A may include one or more Hall elements. According to one example, the first Hall-effect sensing unit may include a chopper-stabilized bridge circuit (e.g., a Wheatstone bridge) that is formed of Hall elements. The first Hall-effect sensing unit 318A may be configured to generate a first internal signal INT_1, which is modulated based on a signal MOD_2.

The amplifier 320A may include a transconductance amplifier. However, alternative implementations are possible in which the amplifier 320A includes another type of amplifier. In operation, the amplifier 320A may be configured to amplify the first internal signal INT_1 to produce a first amplified signal AS_1.

The signal processing circuit 330A may include a modulator 332A, a low-pass filter 323A, and a sinc filter 338A. The modulator 332A may be configured to demodulate the first amplified signal AS_1 at the chopping frequency MOD_2 to produce a demodulated signal AS_1'. The low-pass filter 323A may include a capacitor having a capacitance C, and an amplifier having internal transconductance 1/R, as shown. The low-pass filter may filter the demodulated signal AS_1' to produce a filtered signal AS_1". The sinc filter 338A may be configured to filter the signal AS_1" to produce an output signal OUT_X.

The second Hall-effect sensing unit 318B may include one or more Hall elements. According to one example, the second Hall-effect sensing unit may include a chopper-stabilized bridge circuit (e.g., a Wheatstone bridge) that is formed of Hall elements. The second Hall-effect sensing unit 318B may be configured to generate a second internal signal INT_2, which is modulated based on a signal MOD_2.

The amplifier 320B may include a transconductance amplifier. However, alternative implementations are possible in which the amplifier 320B includes another type of amplifier. In operation, the amplifier 320B may be configured to amplify the second internal signal INT_2 to produce a second amplified signal AS_2.

The signal processing circuit 330B may include a modulator 332B, a low-pass filter 323B, and a sinc filter 338B. The modulator 332B may be configured to demodulate the second amplified signal AS_2 at the chopping frequency MOD_2 to produce a demodulated signal AS_2'. The low-pass filter 323B may include a capacitor having a capacitance C, and an amplifier having internal transconductance 1/R, as shown. The low-pass filter may filter the demodulated signal AS_2' to produce as filtered signal AS_2". The sinc filter 338B may be configured to filter the signal AS_2" to produce an output signal OUT_Y.

The third Hall-effect sensing unit 318C may include one or more Hall elements. According to one example, the third Hall-effect sensing unit may include a chopper-stabilized bridge circuit (e.g., a Wheatstone bridge) that is formed of Hall elements. The third Hall-effect sensing unit 318C may be configured to generate a third internal signal INT_3, which is modulated based on a signal MOD_2.

The amplifier 320C may include a transconductance amplifier. However, alternative implementations are possible in which the amplifier 320C includes another type of amplifier. In operation, the amplifier 320B may be configured to amplify the third internal signal INT_3 to produce a third amplified signal AS_3.

The signal processing circuit 330C may include a modulator 332C, a low-pass filter 323C, and a sinc filter 338C. The modulator 332C may be configured to demodulate the third amplified signal AS_3 at the chopping frequency MOD_2 to produce a demodulated signal AS_3'. The low-pass filter 323C may include a capacitor having a capacitance C, and an amplifier having internal transconductance 1/R, as shown. The low-pass filter may filter the demodulated signal AS_3' to produce as filtered signal AS_3". The sinc filter 338C may be configured to filter the signal AS_3" to produce an output signal OUT_Z.

The gain adjustment circuit 340A may include a subtraction element 345A, a modulator 342A, a modulator 344A, a low-pass filter 341A, and a sinc filter 349A. The subtraction element 345A may be configured to produce a difference signal DS_1 by subtracting the second amplified signal AS_2 from the first amplified signal AS_1. The modulator 342A may demodulate the signal MOD_1 based on the signal MOD_2 to produce a demodulated signal DMS_1. The modulator 344A may demodulate the difference signal DS_1 based on the demodulated signal DMS_1 to produce a signal GA_1. The low-pass filter 341A may filter the signal GA_1 to produce a signal GA_1'. The signal GA_1' may be filtered by the sinc filter 349A to produce the gain adjustment signal GA_Y. The gain adjustment signal GA_Y may be applied at a gain control terminal of the amplifier 320B. The gain adjustment signal GA_Y may effectively set (or control) the gain of the amplifier 320B.

The gain adjustment circuit 340B may include a subtraction element 345B, a modulator 342B, a modulator 344B, a low-pass filter 341B, and a sinc filter 349B. The subtraction element 345B may be configured to produce a difference signal DS_2 by subtracting the third amplified signal AS_3 from the first amplified signal AS_1. The modulator 342B may demodulate the signal MOD_1 based on the signal MOD_2 to produce a demodulated signal DMS_2. The modulator 344B may demodulate the difference signal DS_2 based on the demodulated signal DMS_2 to produce a signal GA_2. The low-pass filter 341B may filter the signal GA_2 to produce a signal GA_2'. The signal GA_2' may be subsequently filtered by the sinc filter 349B to produce the gain adjustment signal GA_Z. The gain adjustment signal GA_Z may be applied at a gain control terminal of the amplifier 320C. The gain adjustment signal GA_Z may effectively set (or control) the gain of the amplifier 320C.

The gain adjustment circuit 340A may be provided with switches 346A and 348A. Switch 346A may be interposed between the modulator 344A and the low-pass filter 341A. Switch 348A may be interposed between the low-pass filter 341A and the sinc filter 349A. Each of switches 346A and 348A may be driven by a clock signal CLK_1. By way of example, when the clock signal CLK_1 is high, each of the switches 346A and 348A may be turned on. When the clock signal CLK_1 is low, each of the switches 346A and 348A may be turned off.

The gain adjustment circuit 340B may be provided with switches 346B and 348B. Switch 346B may be interposed between the modulator 344B and the low-pass filter 341B. Switch 348B may be interposed between the low-pass filter 341B and the sinc filter 349B. Each of switches 346B and 348B may be driven by a clock signal CLK_1. By way of example, when the clock signal CLK_1 is high, each of the switches 346B and 348B may be turned on. When the clock signal CLK_1 is low, each of the switches 346B and 348B may be turned off.

The signal processing circuit 330A may be provided with switches 333A and 337B. Switch 333A may be interposed between the modulator 332A and the low-pass filter 323A. Switch 337A may be interposed between the low-pass filter 323A and the sinc filter 338A. Each of switches 333A and 337A may be driven by a clock signal CLK_2. By way of example, when the clock signal CLK_2 is high, each of the switches 333A and 337A may be turned on. When the clock signal CLK_2 is low, each of the switches 333A and 337A may be turned off.

The signal processing circuit 330B may be provided with switches 333B and 337B. Switch 333B may be interposed between the modulator 332B and the low-pass filter 323B. Switch 337B may be interposed between the low-pass filter 323B and the sinc filter 338B. Each of switches 333B and 337B may be driven by a clock signal CLK_2. By way of example, when the clock signal CLK_2 is high, each of the switches 333B and 337B may be turned on. When the clock signal CLK_2 is low, each of the switches 333B and 337B may be turned off.

The signal processing circuit 330C is provided with switches 333C and 337C. Switch 333C may be interposed between the modulator 332C and the low-pass filter 323C. Switch 337C may be interposed between the low-pass filter 323C and the sine filter 338C. Each of switches 333C and 337C may be driven by a clock signal CLK_2 as shown. By way of example, when the clock signal CLK_2 is set at a logic-high, each of the switches 333C and 337C may be turned on. When the clock signal CLK_2 is set at a logic-low, each of the switches 333C and 337C may be turned off.

Figure 3B:
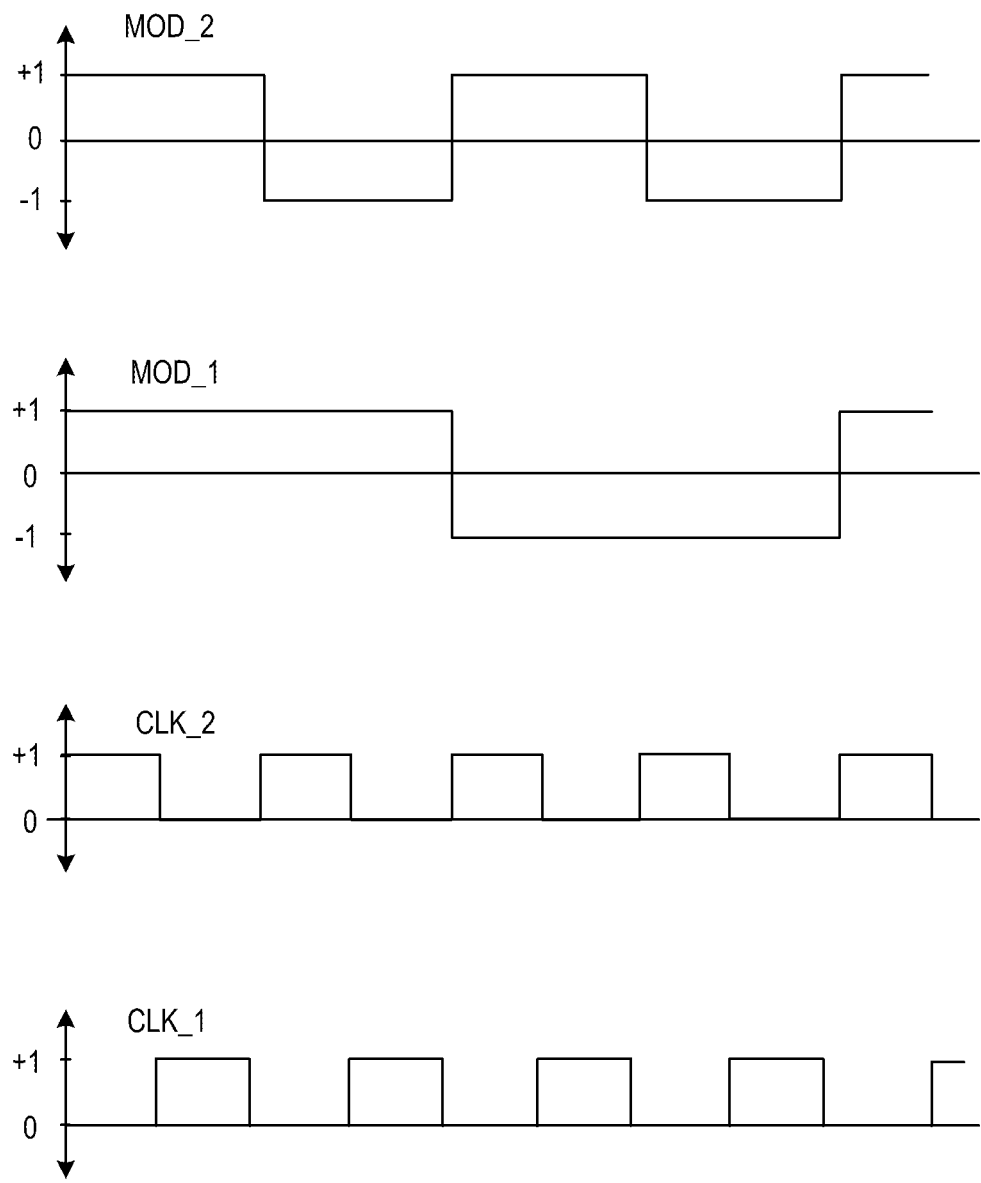
FIG. 3B is a plot of signals that drive the operation of components of the sensor of FIG. 3A.

According to the example of FIG. 3A, the magnetic field generator 310 and the gain adjustment circuits 340A-B are driven by a first clock signal CLK_1. The signal processing circuits 330A-C are driven by a second clock signal CLK_2. As illustrated in FIG. 3B, the first clock signal CLK_1 and the second clock signal CLK_2 are each other's inverse—when the first clock signal CLK_1 is high, the second clock signal CLK_2 is low, and vice versa. As a result of this arrangement, the signal processing circuits 330A-C are active when the gain adjustment circuits 340A-B are inactive, and the signal processing circuits 330A-C are inactive when the gain adjustment circuits 340A-B are active.

According to the example of FIG. 3A, the reference magnetic field (generated by the magnetic field generator 310) is modulated based on a signal MOD_1, while the internal signal INT_1 and the internal signal INT_2 are modulated based on a signal MOD_2. As illustrated in FIG. 3B, the frequency of the signal MOD_2 is twice as large as the frequency of the signal MOD_1, such that a full period of the signal MOD_2 occurs each half-period of the signal MOD_1.

FIG. 3C is a state diagram providing an example of one aspect of the operation of the sensor 300. As illustrated, during its operation, the sensor 300 may alternate between a calibration state 350A and an operating state 350B. When the sensor 300 is in the calibration state 350A: (i) the magnetic field generator 310 generates a reference magnetic field, (ii) the gain adjustment circuits 340A-B generate the gain adjustment signals GA_Y and GA_Z, (iii) the gain adjustment signal GA_Y is used to correct for any sensitivity mismatch between the Hall-effect sensing units 318A and 318B by controlling the gain of amplifier 320B; and (iv) the gain adjustment signal GA_Z is used to correct for any sensitivity mismatch between the Hall-effect sensing units 318A and 318C by controlling the gain of amplifier 320C. When the sensor 300 is in the operating state 350A: (i) the sensor 300 senses an external magnetic field, and (ii) generates output signals OUT_X, OUT_Y, and OUT_Z based on the external magnetic field.

According to the example of FIGS. 3A-C, the sensor 300 is a positional sensor, signal OUT_X indicates the x-coordinate of the position of a target, signal OUT_Y indicates the y-coordinate of the position of the target, and signal OUT_Z indicates the z-coordinate of the position of a target. Although in the example of FIGS. 3A-C the sensor 300 is a positional sensor, alternative implementations are possible in which the sensor 300 is another type of sensor, such as a speed sensor for example. Although in the example of FIGS. 3A-C the Hall-effect sensing units 318A-C includes Hall elements, alternative implementations are possible in which another type of magnetic field sensing element is used, such as a giant magnetoresistive element (GMR) or a tunnel magnetoresistive element (TMR).

When the sensor 300 is in the calibration state 350A, switch 333A may be turned off, switch 337A may be turned off, switch 333B may be turned off, switch 337B may be turned off, switch 333C may be turned off, switch 337C may be turned off, switch 346A may be turned on switch 348A may be turned on, and switch 346B may be turned on, and switch 348B may be turned on. When the sensor 300 is in the operating state 350A, switch 333A may be turned on, switch 337A may be turned on, switch 333B may be turned on, switch 337B may be turned on, switch 333C may be turned on, switch 337C may be turned on, switch 346A may be turned off, switch 348A may be turned off, and switch 346B may be turned off, and switch 348B may be turned off.

The transitions between the states 350A and 350B may be driven by the signals CLK_1 and CLK_2. Specifically, the sensor 300 may transition from the calibration state 350A to the operating state 350B when the signal CLK_1 changes from high to low, and the signal CLK_2 changes from low to high. Similarly, the sensor 200 may transition from the operating state 350B to the calibration state 350A when the signal CLK_1 changes from low to high, and the signal CLK_2 changes from high to low.

In some implementations, the sensor 300 may spend one half of each phase of the Hall-effect sensing units 318A and 318B in the calibration state 350A and the other half in the operating state 350B. As noted above, the signals output by the Hall-effect sensing units 318A and 318B are modulated by the signal MOD_2, whose waveform is shown in FIG. 3B. Each phase of the Hall-effect sensing units 318A-C may correspond to one continuous time period in which the signal MOD_2 is high or one continuous time period in which the signal MOD_2 is low.

In some implementations, each of the Hall-effect sensing units 318A, 318B, 318C may be disposed adjacent to a different coil of the magnetic field generator 310. More particularly, the first Hall-effect sensing unit 318A may be disposed adjacent to the first coil 316A, the second Hall-effect sensing unit 318B may be disposed adjacent to the second coil 316B, and the third Hall-effect sensing unit 318C may be disposed adjacent to the third coil 316C.

FIG. 3A provides an example in which an extra channel is added to the arrangement shown in FIG. 2A. Although in the example of FIG. 3A only one extra channel is added, it will be understood that the methods and techniques illustrated in FIG. 3A may be used to add more channels. In this regard, it will be understood that the example of FIG. 3A is not limited to including three channels only. In some implementations, the added channel may be redundant with one of the other two added channels.

In some implementations, the gain adjustment signal GA_Y and/or the gain adjustment signal GA_Z may be used to detect a failure in any of the signal processing circuits 330A-C. In this regard, it will be understood that the gain adjustment signals GA_Y and/or GA_Z may be used to achieve compliance with one or more Automotive Safety Integrity Level (ASIL) standards. For instance, in some implementations, a processing circuit (not shown) may monitor the value of the gain adjustment signals GA_Y or GA_Z and output an indication of an error when any of the signals GA_Y and GA_Z exceeds a predetermined threshold or falls outside of a predetermined range.

Figure 4A:
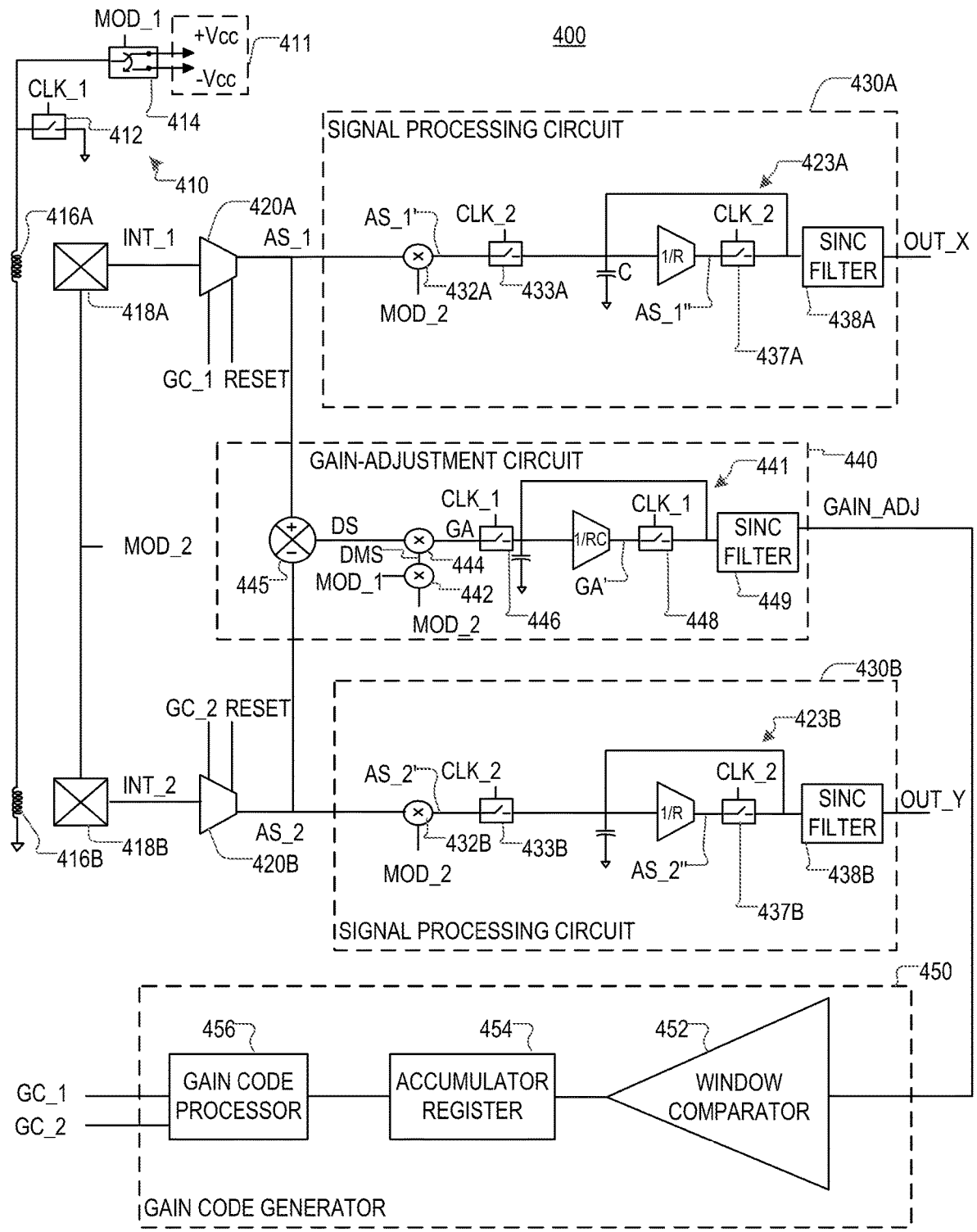
FIG. 4A is a diagram of an example of a sensor, according to aspects of the disclosure.

FIG. 4A is a diagram of an example of a sensor 400, according to aspects of the disclosure. The sensor 400 may include a magnetic field generator 410, a first Hall-effect sensing unit 418A and a second Hall-effect sensing unit 418B, amplifiers 420A-B, signal processing circuits 430A-B, a gain adjustment circuit 440, and a gain code generator 450. The sensor 400 differs from the sensor 200 (shown in FIG. 2A) in that it includes a digital gain code generator (e.g., the gain code generator 450).

The magnetic field generator 410 may include a switch 412, a modulator 414, a first coil 416A, and a second coil 416B. The magnetic field generator 410 may be coupled to a voltage source 411 and it may be configured to generate a reference magnetic field. The modulator 414 may modulate the reference magnetic field based on a signal MOD_1 by varying the polarity of the voltage source 411. The modulator 414 may invert the coil sign every chopping period of the Hall-effect sensing units 418A-B in order to have the reference magnetic field modulated at half the chopping frequency of the Hall-effect sensing units 418A-B.

The first Hall-effect sensing unit 418A may include one or more Hall elements. According to one example, the first Hall-effect sensing unit may include a chopper-stabilized bridge circuit (e.g., a Wheatstone bridge) that is formed of Hall elements. The first Hall-effect sensing unit 418A may be configured to generate a first internal signal INT_1, which is modulated based on a signal MOD_2.

The first amplifier 420A may include a transconductance amplifier. However, alternative implementations are possible in which the first amplifier 420A includes another type of amplifier. In operation, the first amplifier 420A may be configured to amplify the first internal signal INT_1 to produce a first amplified signal AS_1.

The signal processing circuit 430A may include a modulator 432A, a low-pass filter 423A, and a sinc filter 438A. The modulator 432A may be configured to demodulate the first amplified signal AS_1 at the chopping frequency MOD_2 to produce a demodulated signal AS_1'. The low-pass filter 423A may include a capacitor having a capacitance C, and an amplifier having internal transconductance 1/R, as shown. The low-pass filter may filter the demodulated signal AS_1' to produce a filtered signal AS_1". The sinc filter 438A may be configured to filter the signal AS_1" to produce an output signal OUT_X.

The second Hall-effect sensing unit 418B may include one or more Hall elements. According to one example, the second Hall-effect sensing unit may include a chopper-stabilized bridge circuit (e.g., a Wheatstone bridge) that is formed of Hall elements. The second Hall-effect sensing unit 418B may be configured to generate a second internal signal INT_2, which is modulated based on a signal MOD_2.

The second amplifier 420B may include a transconductance amplifier. However, alternative implementations are possible in which the second amplifier 420B includes another type of amplifier. In operation, the second amplifier 420B may be configured to amplify the first internal signal INT_2 to produce a first amplified signal AS_2.

The signal processing circuit 430B may include a modulator 432B, a low-pass filter 423B, and a sinc filter 438B. The modulator 432B may be configured to demodulate the second amplified signal AS_2 at the chopping frequency MOD_2 to produce a demodulated signal AS_2'. The low-pass filter 423B may include a capacitor having a capacitance C, and an amplifier having internal transconductance 1/R, as shown. The low-pass filter 423B may filter the demodulated signal AS_2' to produce as filtered signal AS_2". The sinc filter 438B may be configured to filter the signal AS_2" to produce an output signal OUT_Y.

The gain adjustment circuit 440 may include a subtraction element 445, a modulator 442, a modulator 444, a low-pass filter 441, and a sinc filter 449. The subtraction element 445 may be configured to produce a difference signal DS by subtracting the second amplified signal AS_2 from the first amplified signal AS_1. The modulator 442 may demodulate the signal MOD_1 based on the signal MOD_2 to produce a demodulated signal DMS. The modulator 444 may demodulate the difference signal DS based on the demodulated signal DMS to produce a signal GA. The low-pass filter 441 may filter the signal GA to produce a signal GA'. The signal GA' may be subsequently filtered by the sinc filter 449 to produce the gain adjustment signal GAIN_ADJ. The gain adjustment signal GAIN_ADJ may be provided to the gain code generator 450.

The gain adjustment circuit 440 may be provided with switches 446 and 448. Switch 446 may be interposed between the modulator 444 and the low-pass filter 441. Switch 448 may be interposed between the low-pass filter 441 and the sinc filter 449. Each of switches 446 and 448 may be driven by a clock signal CLK_1. By way of example, when the clock signal CLK_1 is high, each of the switches 446 and 448 may be turned on. When the clock signal CLK_1 is low, each of the switches 446 and 448 may be turned off.

The signal processing circuit 430A may be provided with switches 433A and 437A. Switch 433A may be interposed between the modulator 432A and the low-pass filter 423A. Switch 437A may be interposed between the low-pass filter 423A and the sinc filter 438A. Each of switches 433A and 437A may be driven by a clock signal CLK_2. By way of example, when the clock signal CLK_2 is high, each of the switches 433A and 437A may be turned on. When the clock signal CLK_2 is low, each of the switches 433A and 437A may be turned off.

The signal processing circuit 430B may be provided with switches 433B and 437B. Switch 433B may be interposed between the modulator 432B and the low-pass filter 423B. Switch 437B may be interposed between the low-pass filter 423B and the sinc filter 438B. Each of switches 433B and 437B may be driven by a clock signal CLK_2. By way of example, when the clock signal CLK_2 is high, each of the switches 433B and 437B may be turned on. When the clock signal CLK_2 is low, each of the switches 433B and 437B may be turned off. According to the example of FIG. 4A, the amplifiers 420A and 420B are reset every time the signals CLK_1 and CLK_2 transition from high to low, or from low to high.

Figure 4B:
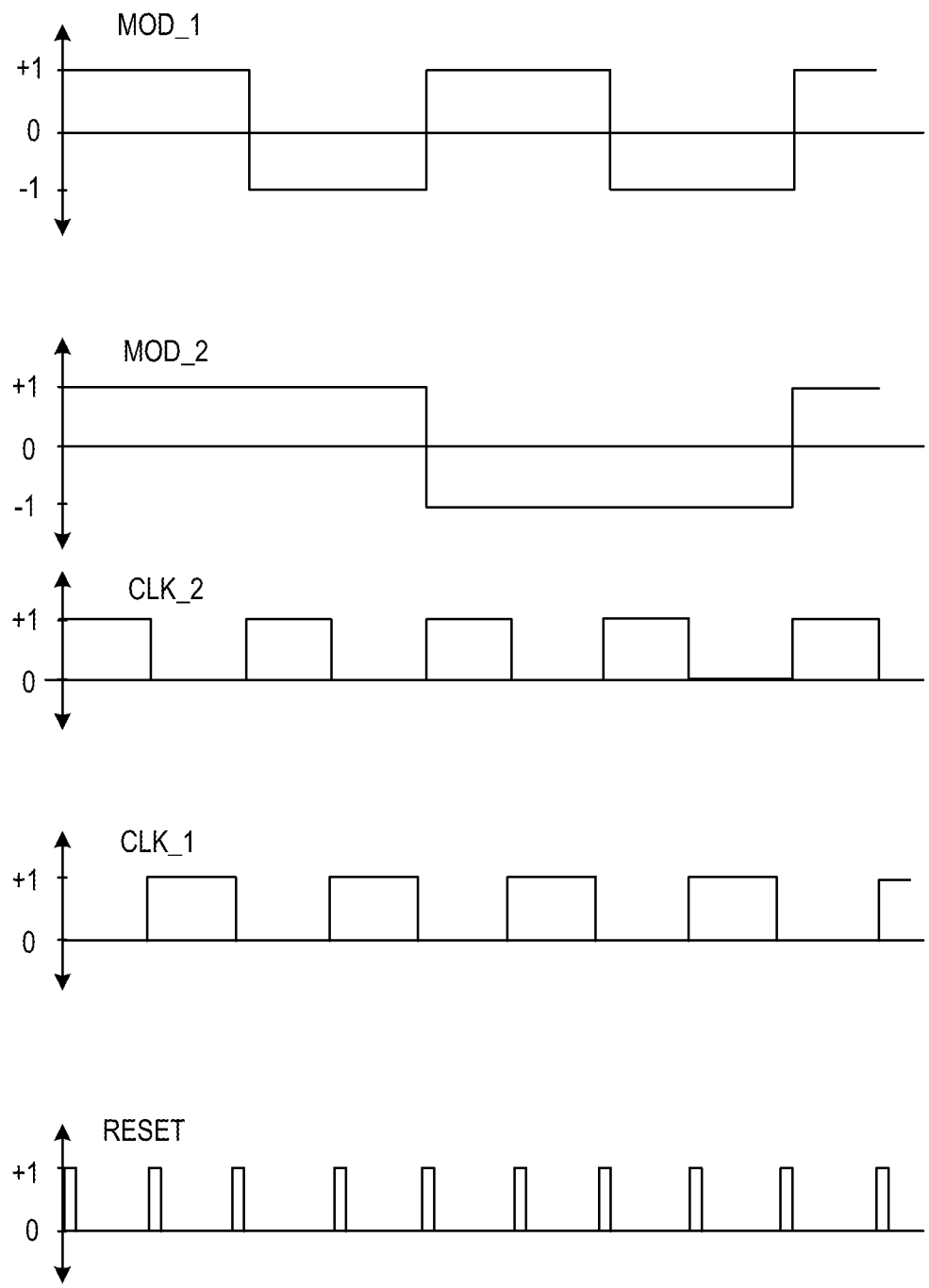
FIG. 4B is a plot of signals that drive the operation of components of the sensor of FIG. 4A.

According to the example of FIG. 4A, the magnetic field generator 410 and the gain adjustment circuits 440 are driven by a first clock signal CLK_1. The signal processing circuits 430A-430B are driven by a second clock signal CLK_2. As illustrated in FIG. 4B, the first clock signal CLK_1 and the second clock signal CLK_2 are each other's inverse—when the first clock signal CLK_1 is high, the second clock signal CLK_2 is low, and vice versa. As a result of this arrangement, the signal processing circuits 430A-430B are active when the gain adjustment circuit 440 IS inactive, and the signal processing circuits 430A-430B are inactive when the gain adjustment circuit 440 is active.

According to the example of FIG. 4A, the reference magnetic field (generated by the magnetic field generator 410) is modulated based on a signal MOD_1, while the internal signal INT_1 and the internal signal INT_2 are modulated based on a signal MOD_2. As illustrated in FIG. 4B, the frequency of the signal MOD_2 is twice as large as the frequency of the signal MOD_1, such that a full period of the signal MOD_2 occurs each half-period of the signal MOD_1.

The gain code generator 450 may include a window comparator 452, an accumulator register 454, and a gain code processor 456. The window comparator 452 may digitize the gain adjustment signal GAIN_ADJ to produce a digital sample of the gain adjustment signal GAIN_ADJ. The window comparator 452 may then compare the digital sample to each of three windows. If the digital sample falls within a first window, the digital sample may decrement the value that is stored in the accumulator register 454 by a first value (e.g., '1'). If the digital sample falls within a second window, the window comparator 452 may leave unchanged the value that is stored in the accumulator register 454. If the digital sample falls within a third window, the window comparator may increment the value that is stored in the accumulator register 454 by a second value (e.g., '1'). In some implementations, each of the first, second, and third windows may include a numerical range. A digital sample may fall within a particular range if the digital sample is greater than or equal to the lower bound of the range and less than or equal to the upper bound of the range. The gain code processor 456 may retrieve the contents of the accumulator register 454 and generate a first gain control code and a second gain control code. The first gain control code may be digitized to produce a gain control signal GC_1 and the second gain control code may be converted to analog form to produce a second gain control signal GC_2. The first gain control signal GC_1 may be applied at a gain control terminal of the first amplifier 420A and used to set the gain of the first amplifier 420A. The second gain control signal GC_2 may be applied at a gain control terminal of the second amplifier 420B and used to set the gain of the second amplifier 420B. Although in the example of FIG. 4 two gain codes are generated, alternative implementations are possible in which only one gain code is generated. In such implementations, the gain of only one of the amplifiers 420A and 420B may be adjusted by using the gain code.

In some implementations, the first gain control code and the second gain control code may be complementary, meaning that when one increases, the other one may decrease. Additionally or alternatively, in some implementations, the first gain control code may be based on the value that is stored in the accumulator register 454 and the second gain control code may be based on the difference between the value that is stored in the accumulator register 454 and the maximum value that can be stored in the accumulator register 454. Consider an example in which the accumulator register 454 is 4 bits wide and the value currently stored in the accumulator register is VAL. Because the accumulator register 454 is 4 bits wide, the maximum value that can be stored in the accumulator register is 15. Accordingly, in this example, the gain code processor 456 may set the first gain control code to equal VAL and the second gain control to equal 15-VAL.

Figure 4C:
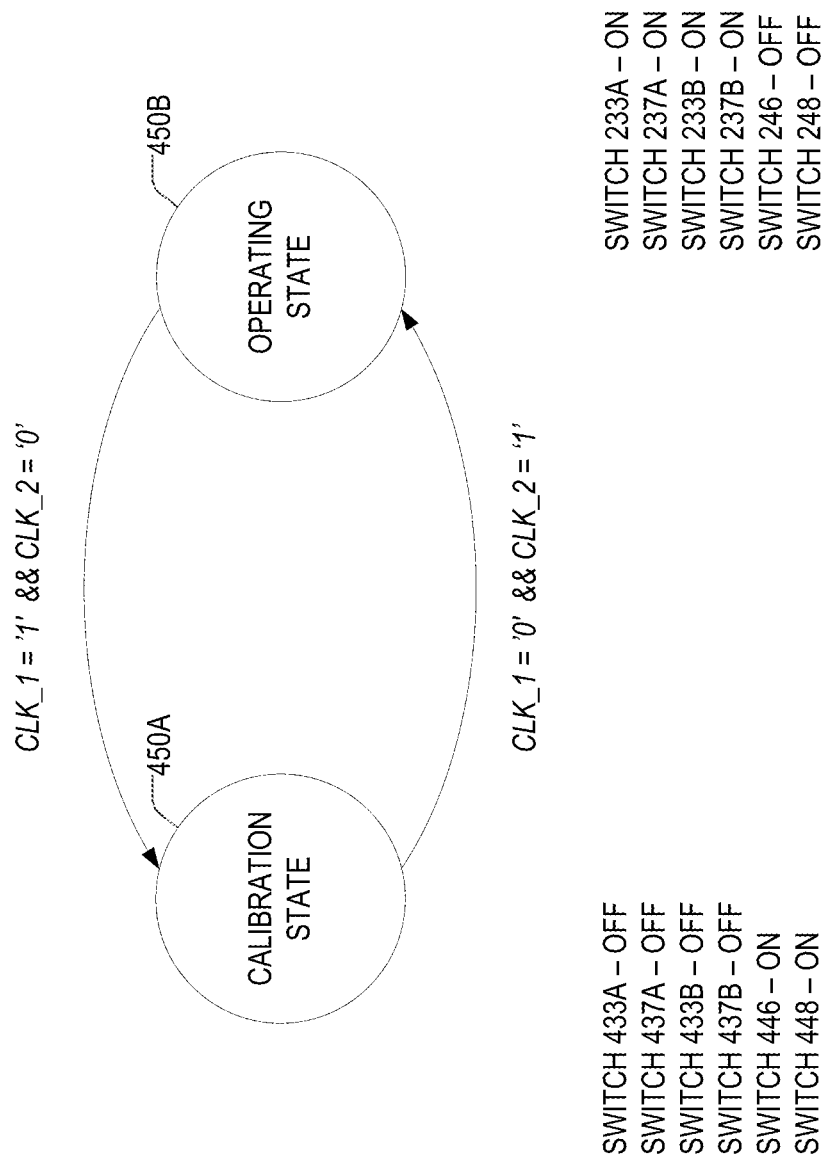
FIG. 4C is a state diagram illustrating the operation of the sensor of FIG. 4A, according to aspects of the disclosure.

FIG. 4C is a state diagram providing an example of one aspect of the operation of the sensor 400. As illustrated, at any given time of its operation, the sensor 400 may be in one of a calibration state 450A and an operating state 450B. When the sensor 400 is in the calibration state 450A: (i) the magnetic field generator 410 generates a reference magnetic field, (ii) the gain adjustment circuit generates a gain adjustment signal GAIN_ADJ, (iii) the gain code generator generates a first gain code and a second gain code, (iv) the first gain code is used to control the gain of the first amplifier 420A, and (v) the second gain code is used to control the gain of the second amplifier 420B. According to the example of FIGS. 4A-C, the first and second gain codes are used to correct for a sensitivity mismatch between the first Hall-effect sensing unit 418A and the second Hall-effect sensing unit 418B by adjusting the respective gains of amplifiers 420A and 420B. When the sensor 400 is in the operating state 250A: (i) the sensor 400 senses an external magnetic field, and (ii) generates output signals OUT_X and OUT_Y based on the external magnetic field.

According to the example of FIGS. 4A-B, the sensor 400 is a positional sensor, signal OUT_X indicates the x-coordinate of the position of a target, and signal OUT_Y indicates the y-coordinate of the position of the target. Although in the example of FIGS. 4A-C the sensor 400 is a positional sensor, alternative implementations are possible in which the sensor 400 is another type of sensor, such as a speed sensor for example. Although in the example of FIGS. 4A-C the sensing units 418A-B includes Hall elements, alternative implementations are possible in which another type of magnetic field sensing element is used, such as a giant magnetoresistive element (GMR) element or a tunnel magnetoresistive element (TMR).

When the sensor 400 is in the calibration state 450A, switch 433A may be turned off, switch 437A may be turned off, switch 433B may be turned off, switch 437B may be turned off, switch 446 may be turned on and switch 448 may be turned on. When the sensor 400 is in the operating state 450B, switch 433A may be turned on, switch 437A may be turned on, switch 433B may be turned on, switch 437B may be turned on, switch 446 may be turned off, and switch 448 may be turned off.

The transitions between the states 450A and 450B may be driven by the signals CLK_1 and CLK_2. Specifically, the sensor 400 may transition from the calibration state 450A to the operating state 450B when the signal CLK_1 changes from high to low, and the signal CLK_2 changes from low to high. Similarly, the sensor 400 may transition from the operating state 450B to the calibration state 450A when the signal CLK_1 changes from low to high, and the signal CLK_2 changes from high to low.

In some implementations, the sensor 400 may spend one half of each phase of the Hall-effect sensing units 418A and 418B in the calibration state 450A and the other half in the operating state 450B. As noted above, the signals output by the Hall-effect sensing units 418A and 418B are modulated by the signal MOD_2, whose waveform is shown in FIG. 4B. Each phase of the Hall-effect sensing units 418A and 418B may correspond to one continuous time period in which the signal MOD_2 is high or one continuous time period in which the signal MOD_2 is low.

In some implementations, each of the Hall-effect sensing units 418A and 418B may be disposed adjacent to a different coil of the magnetic field generator 410. More particularly, the Hall-effect sensing unit 418A may be disposed adjacent to the first coil 416A and the Hall-effect sensing unit 418B may be disposed adjacent to the second coil 416B.

In some implementations, the gain control code(s) that are generated by the gain code generator 450 may be used to detect a failure in any of the signal processing circuits 430A-B. In this regard, it will be understood that the gain code(s) may be used to achieve compliance with one or more Automotive Safety Integrity Level (ASIL) standards. For instance, in some implementations, a processing circuit (not shown) may monitor the value of the gain codes GC_1 and/or GC_2 and output an indication of an error when any of the gain codes GC_1 and GC_2 exceeds a predetermined threshold or falls outside of a predetermined range.

In some implementations, any of the sensors 200, 300, and 400 may be an angle sensor. In such implementations, the Hall-effect sensing units in the sensor may be orthogonal to each other, and output signals output from each signal processing circuits (e.g., OUT_X, OUT_Y, and/or OUT_Z) may be processed by using a CORDIC processor.

Having described preferred embodiments, which serve to illustrate various concepts, structures and techniques, which are the subject of this patent, it will now become apparent that other embodiments incorporating these concepts, structures and techniques may be used. Accordingly, it is submitted that the scope of the patent should not be limited to the described embodiments but rather should be limited only by the spirit and scope of the following claims.

The invention claimed is:

1. A sensor comprising:
a reference magnetic field generator configured to generate a reference magnetic field that is modulated at a first frequency;
a first magnetic field sensing element that is configured to generate a first internal signal that is modulated at a second frequency;
a second magnetic field sensing element that is configured to generate a second internal signal that is modulated at the second frequency;
a first amplifier configured to receive the first internal signal and output a first amplified signal;
a second amplifier configured to receive the second internal signal and output a second amplified signal; and
a gain adjustment circuit configured to: generate a difference signal by subtracting the first amplified signal from the second amplified signal, demodulate the difference signal at the first frequency and the second frequency to produce a gain adjustment signal, and adjust respective gains of the first amplifier and the second amplifier based on the gain adjustment signal,
wherein the gain adjustment signal includes a differential feedback signal having a first component that is used to adjust the gain of the first amplifier and a second component that is used to adjust the gain of the second amplifier.

2. The sensor of claim 1, wherein the second frequency is twice as large as the first frequency.

3. The sensor of claim 1, wherein the first amplifier includes a first transconductance amplifier and the second amplifier includes a second transconductance amplifier.

4. The sensor of claim 1, wherein the gain adjustment signal includes a single-ended signal, and adjusting the gain of at least one of the first amplifier and the second amplifier includes adjusting the gain of only one of the first amplifier and the second amplifier based on the gain adjustment signal.

5. A sensor comprising:
a reference magnetic field generator configured to generate a reference magnetic field that is modulated at a first frequency;
a first magnetic field sensing element that is configured to generate a first internal signal that is modulated at a second frequency,
a second magnetic field sensing element that is configured to generate a second internal signal that is modulated at the second frequency;

a first amplifier configured to receive the first internal signal and output a first amplified signal;

a second amplifier configured to receive the second internal signal and output a second amplified signal;

a gain adjustment circuit configured to generate a difference signal by subtracting the first amplified signal from the second amplified signal, demodulate the difference signal at the first frequency and the second frequency to produce a gain adjustment signal, and adjust a gain of at least one of the first amplifier and the second amplifier based on the gain adjustment signal;

a first signal processing circuit that is configured to generate a first output signal based on the first amplified signal; and a second signal processing circuit that is configured to generate a second output signal based on the second amplified signal, wherein the reference magnetic field generator and the gain adjustment circuit are driven by a first clock signal, the first clock signal having a first waveform, and wherein the first signal processing circuit and the second signal processing circuit are driven by a second clock signal, the second clock signal having a second waveform that is inverse of the first waveform.

6. A sensor comprising:

a reference magnetic field generator configured to generate a reference magnetic field that is modulated at a first frequency;

a first magnetic field sensing element that is configured to generate a first internal signal that is modulated at a second frequency;

a second magnetic field sensing element that is configured to generate a second internal signal that is modulated at the second frequency;

a first amplifier configured to receive the first internal signal and output a first amplified signal;

a second amplifier configured to receive the second internal signal and output a second amplified signal;

a gain adjustment circuit configured to: generate a difference signal by subtracting the first amplified signal from the second amplified signal, demodulate the difference signal at the first frequency and the second frequency to produce a gain adjustment signal, and adjust a gain of at least one of the first amplifier and the second amplifier based on the gain adjustment signal;

a first signal processing circuit that is configured to generate a first output signal based on the first amplified signal; and a second signal processing circuit that is configured to generate a second output signal based on the second amplified signal, wherein the gain adjustment circuit is active during each of a plurality of first periods, and wherein the first signal processing circuit and the second signal processing circuit are active during each of a plurality of second periods.

7. The sensor of claim 1, wherein at least one of the first amplifier and the second amplifier is reset when the gain of the at least one of the first amplifier and the second amplifier is adjusted.

8. The sensor of claim 1, further comprising:

a gain code generator that is configured to receive the gain adjustment signal and generate a gain code based on the gain adjustment signal, wherein adjusting the gain of at least one of the first amplifier and the second amplifier based on the gain adjustment signal includes adjusting the gain of at least one of the first amplifier and the second amplifier based on the gain code.

9. A sensor comprising:

a reference magnetic field generator configured to generate a reference magnetic field that is modulated at a first frequency;

a first magnetic field sensing element that is configured to generate a first internal signal that is modulated at a second frequency;

a second magnetic field sensing element that is configured to generate a second internal signal that is modulated at the second frequency;

a first amplifier configured to receive the first internal signal and output a first amplified signal;

a second amplifier configured to receive the second internal signal and output a second amplified signal;

a gain adjustment circuit configured to: generate a difference signal by subtracting the first amplified signal from the second amplified signal, demodulate the difference signal at the first frequency and the second frequency to produce a gain adjustment signal, and adjust a gain of at least one of the first amplifier and the second amplifier based on the gain adjustment signal; and a gain code generator that is configured to receive the gain adjustment signal and generate a gain code based on the gain adjustment signal, wherein adjusting the gain of at least one of the first amplifier and the second amplifier based on the gain adjustment signal includes adjusting the gain of at least one of the first amplifier and the second amplifier based on the gain code.

a window comparator that is configured to obtain a sample of the gain adjustment signal, identify a threshold window that matches the sample, and increment or decrement a first value that is stored in a register by a second value that corresponds to the threshold window; and a gain code processor that is configured to generate the gain code based on the first value.

10. The sensor of claim 1, wherein the reference magnetic field generator includes a coil.

11. A sensor comprising:

a first amplifier configured to receive a first internal signal and output a first amplified signal, the first internal signal being generated by a first magnetic field sensing element, the first internal signal being generated, at least in part, in response to a reference magnetic field that is modulated at a first frequency, the first internal signal being modulated at a second frequency;

a second amplifier configured to receive a second internal signal and output a second amplified signal, the second internal signal being generated by a second magnetic field sensing element, the second internal signal being generated, at least in part, in response to the reference magnetic field that is modulated at the first frequency, the second internal signal being modulated at the second frequency; and a gain adjustment circuit configured to: generate a difference signal by subtracting the first amplified signal from the second amplified signal, demodulate the difference signal at the first frequency and the second frequency to produce a gain adjustment signal, and adjust respective gains of the first amplifier and the second amplifier based on the gain adjustment signal, wherein the gain adjustment signal includes a differential feedback signal having a first component that is used to adjust the gain of the first amplifier and a second component that is used to adjust the gain of the second amplifier.

12. The sensor of claim 11, wherein the second frequency is twice as large as the first frequency.

13. The sensor of claim 11, wherein the first amplifier includes a first transconductance amplifier and the second amplifier includes a second transconductance amplifier.

14. The sensor of claim 11, wherein the gain adjustment signal includes a single-ended signal, and adjusting the gain of at least one of the first amplifier and the second amplifier includes adjusting the gain of only one of the first amplifier and the second amplifier based on the gain adjustment signal.

15. A sensor comprising:
a first amplifier configured to receive a first internal signal and output a first amplified signal, the first internal signal being generated by a first magnetic field sensing element, the first internal signal being generated, at least in part, in response to a reference magnetic field that is modulated at a first frequency, the first internal signal being modulated at a second frequency;
a second amplifier configured to receive a second internal signal and output a second amplified signal, the second internal signal being generated by a second magnetic field sensing element, the second internal signal being generated, at least in part, in response to the reference magnetic field that is modulated at the first frequency, the second internal signal being modulated at the second frequency;
a gain adjustment circuit configured to: generate a difference signal by subtracting the first amplified signal from the second amplified signal, demodulate the difference signal at the first frequency and the second frequency to produce a gain adjustment signal, and adjust a gain of at least one of the first amplifier and the second amplifier based on the gain adjustment signal;
a first signal processing circuit that is configured to generate a first output signal based on the first amplified signal; and
a second signal processing circuit that is configured to generate a second output signal based on the second amplified signal,
wherein the gain adjustment circuit is driven by a first clock signal, the first clock signal having a first waveform, and
wherein the first signal processing circuit and the second signal processing circuit are driven by a second clock signal, the second clock signal having a second waveform that is inverse of the first waveform.

16. A sensor comprising:
a first amplifier configured to receive a first internal signal and output a first amplified signal, the first internal signal being generated by a first magnetic field sensing element, the first internal signal being generated, at least in part, in response to a reference magnetic field that is modulated at a first frequency, the first internal signal being modulated at a second frequency;
a second amplifier configured to receive a second internal signal and output a second amplified signal, the second internal signal being generated by a second magnetic field sensing element, the second internal signal being generated, at least in part, in response to the reference magnetic field that is modulated at the first frequency, the second internal signal being modulated at the second frequency;
a gain adjustment circuit configured to: generate a difference signal by subtracting the first amplified signal from the second amplified signal, demodulate the difference signal at the first frequency and the second frequency to produce a gain adjustment signal, and adjust a gain of at least one of the first amplifier and the second amplifier based on the gain adjustment signal;
a first signal processing circuit that is configured to generate a first output signal based on the first amplified signal; and
a second signal processing circuit that is configured to generate a second output signal based on the second amplified signal,
wherein the gain adjustment circuit is active during each of a plurality of first periods, and
wherein the first signal processing circuit and the second signal processing circuit are active during each of a plurality of second periods.

17. The sensor of claim 11, wherein at least one of the first amplifier and the second amplifier is reset when the gain of the at least one of the first amplifier and the second amplifier is adjusted.

18. The sensor of claim 11, wherein the reference magnetic field generator includes a coil.

19. A sensor comprising:
a first amplifier configured to receive a first internal signal and output a first amplified signal, the first internal signal being generated by a first magnetic field sensing element, the first internal signal being generated, at least in part, in response to a reference magnetic field that is modulated at a first frequency, the first internal signal being modulated at a second frequency;
a second amplifier configured to receive a second internal signal and output a second amplified signal, the second internal signal being generated by a second magnetic field sensing element, the second internal signal being generated, at least in part, in response to the reference magnetic field, the second internal signal being modulated at the second frequency;
a gain adjustment circuit configured to: generate a difference signal by subtracting the first amplified signal from the second amplified signal, demodulate the difference signal at the first frequency and the second frequency to produce a gain adjustment signal; and
a gain code generator that is configured to receive the gain adjustment signal, generate a gain code based on the gain adjustment signal, and adjust a gain of at least one of the first amplifier and the second amplifier,
wherein the gain code generator includes: a window comparator that is configured to obtain a sample of the gain adjustment signal, identify a threshold window that matches the sample, and increment or decrement a first value that is stored in a register by a second value that corresponds to the threshold window, and a gain code processor that is configured to generate the gain code based on the first value.

20. The sensor of claim 19, wherein the reference magnetic field generator includes a coil.

21. The sensor of claim 1, wherein:
the gain adjustment circuit is driven by a clock signal, such that the gain adjustment signal is determined when the clock signal transitions from a first value to a second value, and the first and second amplifiers are reset in-sync with the clock signal.

22. The sensor of claim 11, wherein:

the gain adjustment circuit is driven by a clock signal, such that the gain adjustment signal is determined when the clock signal transitions from a first value to a second value, and the first and second amplifiers are reset in-sync with the clock signal.

* * * * *

UNITED STATES PATENT AND TRADEMARK OFFICE
CERTIFICATE OF CORRECTION

PATENT NO. : 11,630,130 B2
APPLICATION NO. : 17/218315
DATED : April 18, 2023
INVENTOR(S) : Ezequiel Rubinsztain et al.

It is certified that error appears in the above-identified patent and that said Letters Patent is hereby corrected as shown below:

In the Specification

Column 1, Line 56 delete "signa" and replace with --signal--.

Column 1, Line 57 delete "amplifier" and replace with --amplifiers--.

Column 4, Line 14 delete "refers the" and replace with --refers to the--.

Column 4, Line 47 delete "sine" and replace with --sinc--.

Column 4, Line 55 delete "sine" and replace with --sinc--.

Column 4, Line 59 delete "sine" and replace with --sinc--.

Column 5, Line 1 delete "sine" and replace with --sinc--.

Column 5, Line 22 delete "sine" and replace with --sinc--.

Column 5, Line 32 delete "sine" and replace with --sinc--.

Column 5, Line 42 delete "sine" and replace with --sinc--.

Signed and Sealed this
Third Day of December, 2024

Katherine Kelly Vidal
*Director of the United States Patent and Trademark Office*